United States Patent
Matsui

(10) Patent No.: US 8,304,962 B2
(45) Date of Patent: Nov. 6, 2012

(54) ULTRASONIC MOTOR

(75) Inventor: Akira Matsui, Hino (JP)

(73) Assignee: Olympus Corporation, Tokyo (JP)

( * ) Notice: Subject to any disclaimer, the term of this patent is extended or adjusted under 35 U.S.C. 154(b) by 67 days.

(21) Appl. No.: 13/031,967

(22) Filed: Feb. 22, 2011

(65) Prior Publication Data

US 2011/0204748 A1 Aug. 25, 2011

(30) Foreign Application Priority Data

Feb. 22, 2010 (JP) ................................. 2010-036338

(51) Int. Cl.
*H01L 41/08* (2006.01)
(52) U.S. Cl. .......... 310/323.02; 310/323.12; 310/323.16
(58) Field of Classification Search .................. 310/328, 310/333
See application file for complete search history.

(56) References Cited

U.S. PATENT DOCUMENTS

| | | | | |
|---|---|---|---|---|
| 5,723,935 A | * | 3/1998 | Tomikawa et al. | 310/323.02 |
| 6,252,332 B1 | * | 6/2001 | Takagi et al. | 310/323.02 |
| 6,469,419 B2 | * | 10/2002 | Kato et al. | 310/323.02 |
| 2010/0019621 A1 | * | 1/2010 | Funakubo et al. | 310/323.16 |

FOREIGN PATENT DOCUMENTS

JP 09-085172 3/1997

* cited by examiner

*Primary Examiner* — Mark Budd
(74) *Attorney, Agent, or Firm* — Scully, Scott, Murphy & Presser, P.C.

(57) ABSTRACT

An elliptical vibration is generated by combining a longitudinal primary resonance vibration of the vibrator resulting from an expansion and a contraction of the vibrator in a direction of the central axis and a torsional resonance vibration resulting from twisting of the vibrator around the central axis as a torsional axis. The dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibrations resulting from twisting of the vibrator around the central axis as the torsional axis match. The ultrasonic motor further includes a vibration detecting electrode layer.

4 Claims, 18 Drawing Sheets

120

FIG.13A
FIG.13B
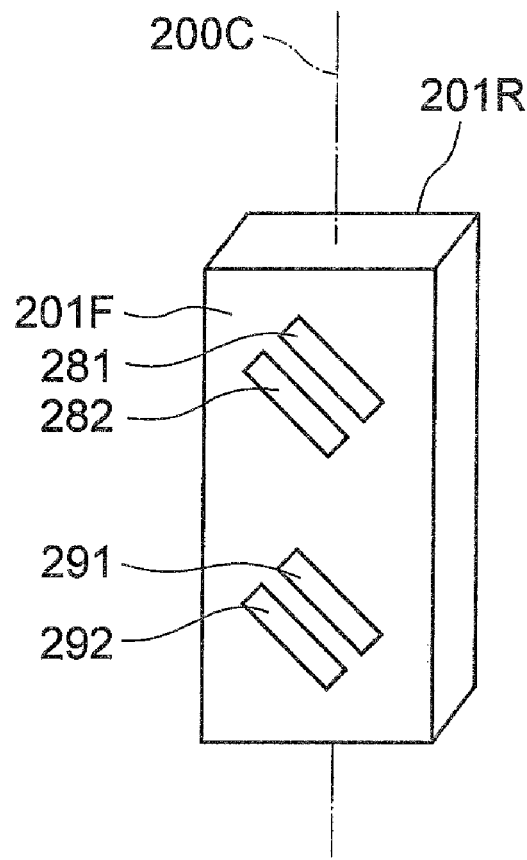
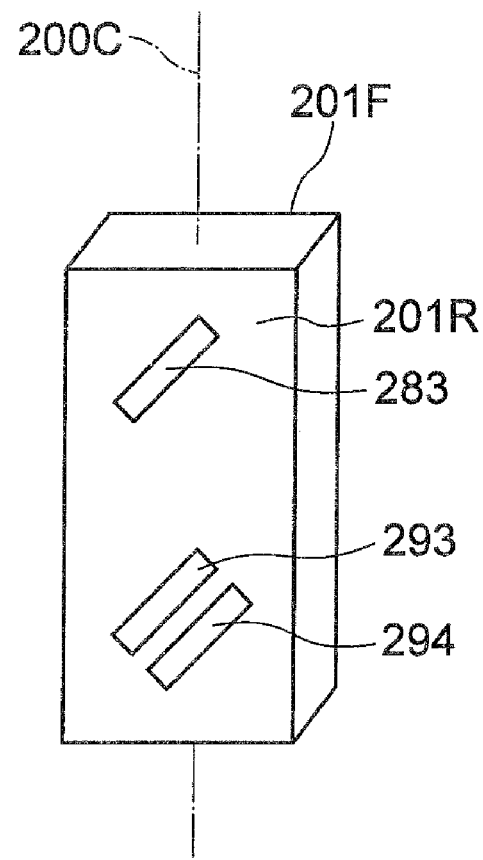

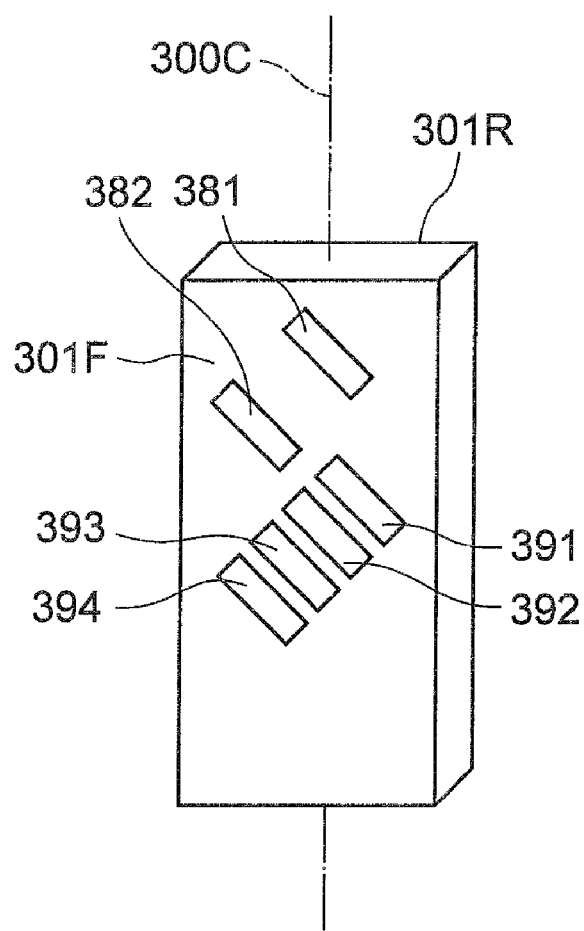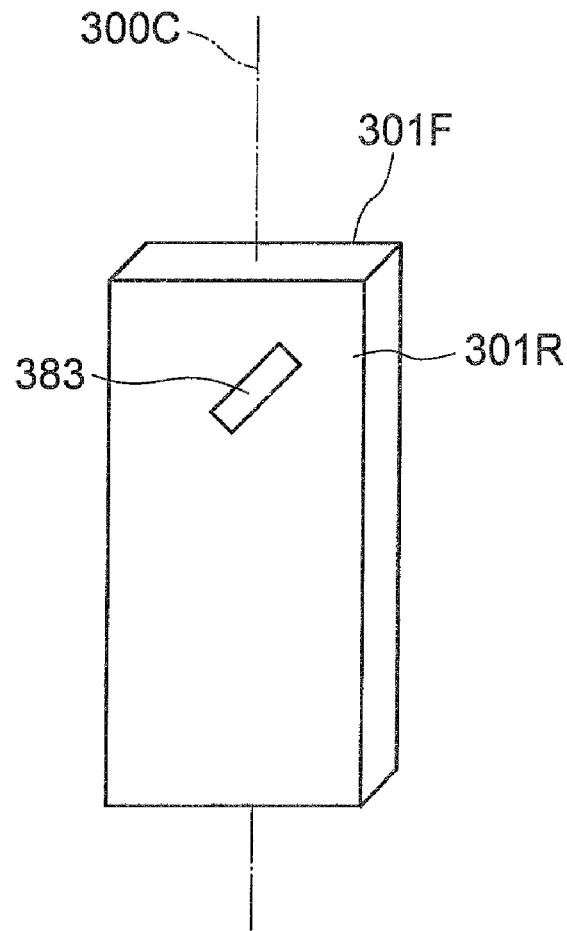

ULTRASONIC MOTOR

CROSS-REFERENCE TO RELATED APPLICATIONS

The present application is based upon and claims the benefit of priority from the prior Japanese Patent Application No. 2010-036338 filed on Feb. 22, 2010; the entire contents of which are incorporated herein by reference.

BACKGROUND OF THE INVENTION

1. Field of the Invention

The present invention relates to an ultrasonic motor.

2. Description of the Related Art

There have been proposed ultrasonic motors that generate an elliptical vibration by combining a longitudinal vibration and a torsional vibration, and rotate a rotor.

For example, in an ultrasonic vibrator disclosed in Patent Application Laid-open No. H9-85172, a pair or a plurality of pairs of multilayered piezoelectric elements is held between holding elastic bodies that are provided integrally with a basal elastic body, and that have a recessed portion in which the multilayered piezoelectric element can be inserted. Furthermore, the multilayered piezoelectric elements are fixed to the basal elastic body with screws in a state in which a compressive stress is applied with the holding elastic bodies abut on piezoelectric elements.

However, the ultrasonic vibrator disclosed in Japanese Patent Application Laid-open No. H9-85172 has various drawbacks. For example, the holding elastic bodies are required for fixing the piezoelectric elements and an oblique recessed portion must be formed in the elastic bodies for arranging the holding elastic bodies and the piezoelectric elements. Thus, the overall structure of the conventional vibrator is very complicated.

Furthermore, a plurality of the piezoelectric elements for detecting vibrations is arranged between a plurality of the pairs of the multilayered piezoelectric elements and the holding elastic bodies, and when driving such a vibrator, two wirings are required for driving a piezoelectric element for driving and two wirings are required for detecting the vibrations of the piezoelectric element for detecting vibrations, thus requiring at least eight wirings. Because of the many wirings required for driving the vibrator, downsizing the ultrasonic vibrator cannot be achieved.

SUMMARY OF THE INVENTION

The present invention is made in view of the above discussion, and it is an object of the present invention to provide an ultrasonic motor that has a simplified overall structure and less number of wirings.

To solve the above problems and to achieve the above objects, according to an aspect of the present invention, an ultrasonic motor at least includes a vibrator having a dimension ratio of a rectangle in a cross-section orthogonal to a central axis; and a rotor that is in contact with an elliptical vibration generating surface of the vibrator and that is rotated around the central axis, which is orthogonal to the elliptical vibration generating surface. An elliptical vibration is generated by combining a longitudinal primary resonance vibration resulting from an expansion and a contraction of the vibrator in a direction of the central axis and a torsional resonance vibration resulting from twisting of the vibrator around the central axis as a torsional axis, and the dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibration resulting from twisting of the vibrator around the central axis as the torsional axis match. The ultrasonic motor includes a vibration detecting electrode layer.

In the ultrasonic motor according to the above aspect, it is preferable that the torsional resonance vibration is a torsional secondary resonance vibration.

In the ultrasonic motor according to the above aspect, it is preferable that the torsional resonance vibration is a torsional tertiary resonance vibration.

In the ultrasonic motor according to the above aspect, it is preferable that the vibrator is formed by stacking a plurality of piezoelectric sheets, the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and polarity directions of the internal electrodes at the positions on either side of the center in the width direction of the piezoelectric sheet are the same.

In the ultrasonic motor according to the above aspect, it is preferable that the vibrator is formed by stacking a plurality of piezoelectric sheets, the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and polarity directions at the positions on either side of the center in the width direction of the piezoelectric sheet are reversed.

In the ultrasonic motor according to the above aspect, it is preferable that a driving electrode layer is formed at a position including a node of at least the torsional resonance vibration, and the vibration detecting electrode layer is formed in a direction that is the same stacking direction of the driving electrode layer.

In the ultrasonic motor according to the above aspect, it is preferable that a driving electrode layer is formed at a position including a node of the torsional resonance vibration, and the vibration detecting electrode layer is formed at a position, including a node of the torsional resonance vibration, different from the node having the driving electrode layer formed thereon.

In the ultrasonic motor according to the above aspect, it is preferable that the driving electrode layer is formed at the position including a common node of the torsional resonance vibration and the longitudinal primary resonance vibration.

In the ultrasonic motor according to the above aspect, it is preferable that among external electrodes provided in the vibrator so as to be conductive with vibration detecting electrodes and driving electrodes, the external electrodes that are connected during driving and conductive with the vibration detecting electrodes and the driving electrodes are formed on the same outer surface of the vibrator, and the external electrode used only during polarization is formed on an opposing outer surface of the vibrator.

BRIEF DESCRIPTION OF THE DRAWINGS

FIG. 13A is a perspective view, from an upper front side, of a structure of a vibrator according to a modification of the second embodiment and FIG. 13B is a perspective view, from an upper rear side, of a structure of the vibrator;

FIG. 17A is a perspective view, from an upper front side, of a structure of the vibrator cut from the multilayered piezoelectric element according to the third embodiment and FIG. 17B is a perspective view, from an upper rear side, of a structure of the vibrator.

DETAILED DESCRIPTION OF THE INVENTION

Exemplary embodiments of an ultrasonic motor according to the present invention are explained in detail below with reference to the accompanying drawings. The present invention is not limited by the following embodiments.

First Embodiment

Figure 1:
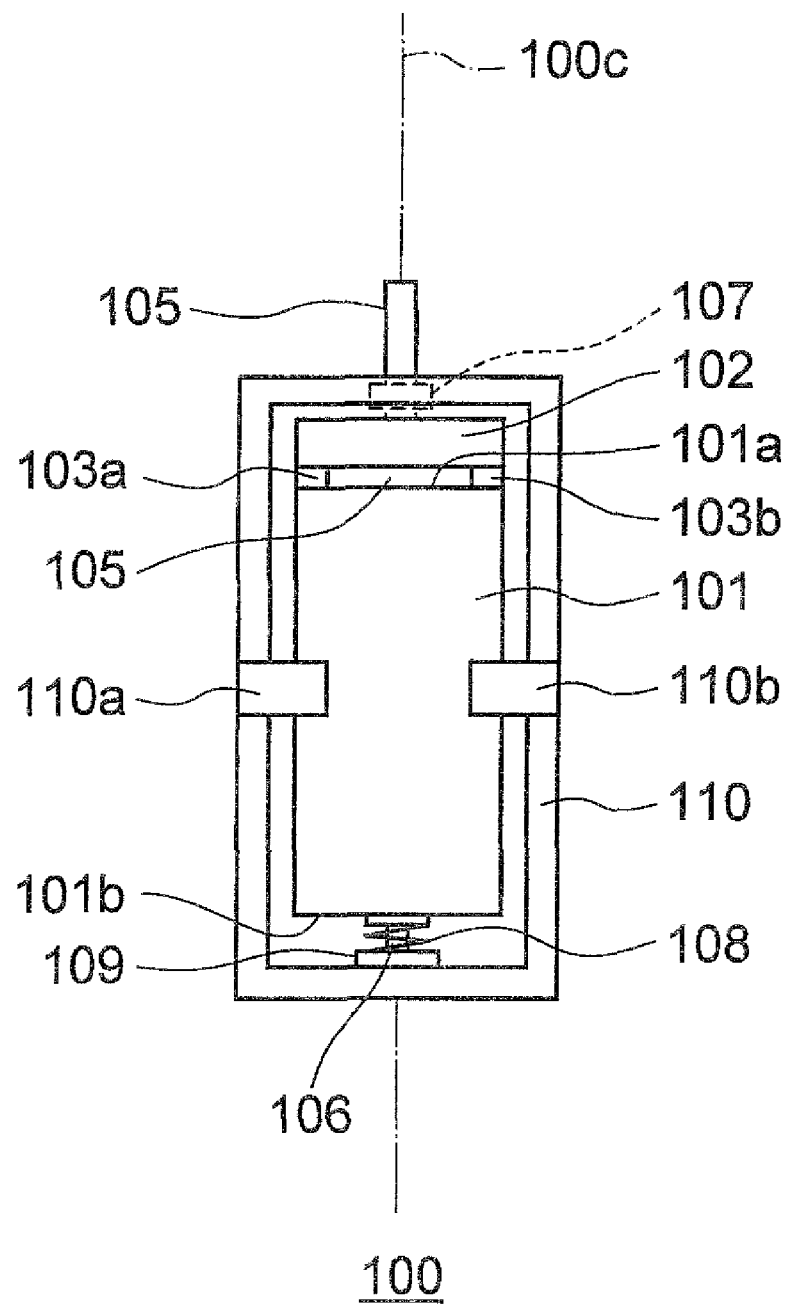
FIG. 1 is a front view of a structure of an ultrasonic motor according to a first embodiment of the present invention.

FIG. 1 is a front view of a structure of an ultrasonic motor 100 according to a first embodiment of the present invention.

The ultrasonic motor 100 includes a vibrator 101 and a rotor 102. The vibrator 101 is a piezoelectric element of a substantially rectangular parallelepiped shape having a dimension ratio of a rectangle in a cross-section orthogonal to its central axis 100c (rotation axis). Supporting members 110a and 110b that extend from a holder 110 arranged so as to enclose the vibrator 101 are fixed near a node of the vibrator 101 (piezoelectric element).

The rotor 102 is substantially disk-shaped. A bottom surface of the rotor 102 is in contact with friction contact members 103a and 103b that are arranged on an elliptical vibration generating surface 101a that is on an upper surface of the vibrator 101. A shaft 105 extends from a center of an upper surface of the rotor 102 along the central axis 100c. The shaft 105 is coupled to a bearing 107 held by the holder 110.

A second shaft 106 that extends along the central axis 100c abuts against a base 101b of the vibrator 101. One end of the second shaft 106 is fixed to an inner surface of the holder 110 and the other end passes through a spring 108 and a hole of a spring holding ring 109.

The spring holding ring 109 and the second shaft 106 are screwed to each other. A position of the spring holding ring 109 on the second shaft 106, that is, a pressing force of the spring 108, can be adjusted by rotating the spring holding ring 109. In other words, a force by which the rotor 102 presses the friction contact members 103a and 103b can be adjusted by rotating the spring holding ring 109.

When the vibrator 101 is driven, the rotor 102 is rotated around the central axis 100c that is orthogonal to the elliptical vibration generating surface 101a of the vibrator 101.

Figure 2A:
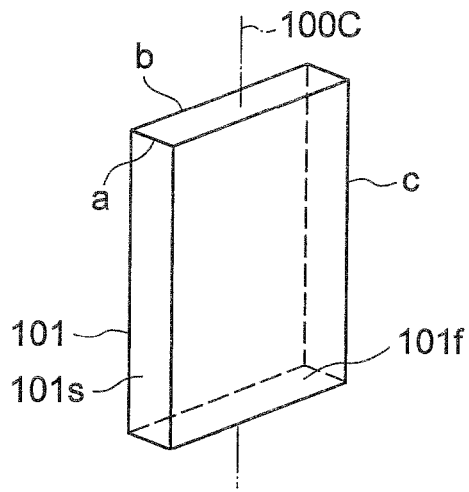
FIG. 2A is a perspective view of a schematic structure of a vibrator according to the first embodiment.
Figure 2B:
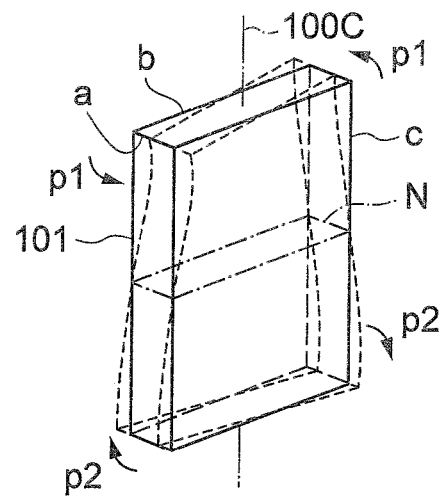
FIG. 2B is a perspective view that depicts with a dotted line a vibration state of the vibrator in a torsional primary vibration mode.
Figure 2C:
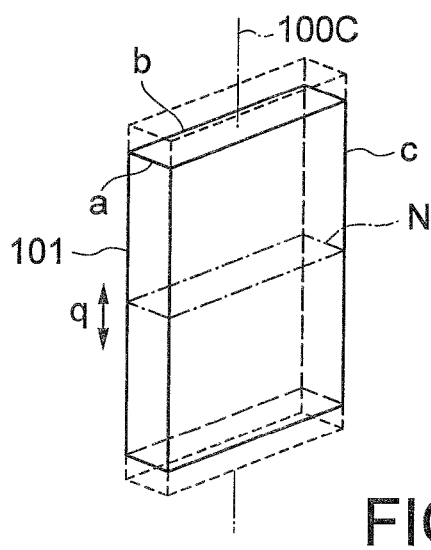
FIG. 2C is a perspective view that depicts with a dotted line a vibration state of the vibrator in a longitudinal primary vibration mode.
Figure 2D:
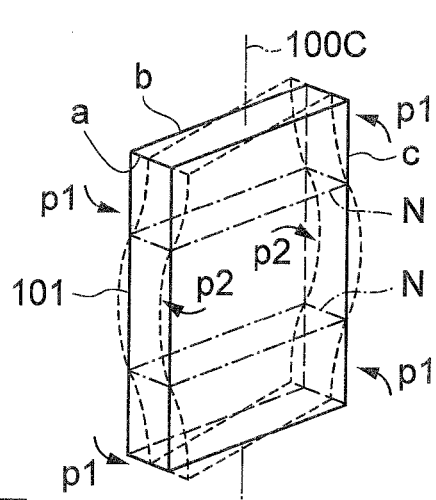
FIG. 2D is a perspective view that depicts with a dotted line a vibration state of the vibrator in a torsional secondary vibration mode.

How individual frequencies of the vibrator 101 (piezoelectric element) included in the ultrasonic motor 100 are matched is explained below with reference to FIGS. 2A to 3. FIG. 2A is a perspective view of a schematic structure of the vibrator 101 according to the first embodiment. FIG. 2B is a perspective view that depicts with a dotted line a vibration state of the vibrator 101 in a torsional primary vibration mode. FIG. 2C is a perspective view that depicts with a dotted line a vibration state of the vibrator 101 in a longitudinal primary vibration mode. FIG. 2D is a perspective view that depicts with a dotted line a vibration state of the vibrator 101 in a torsional secondary vibration mode and FIG. 2E is a perspective view that depicts with a dotted line a vibration state of the vibrator 101 in a torsional tertiary vibration mode.

As shown in FIG. 2A, the vibrator 101 has a substantially rectangular parallelepiped shape. A length of a short side 101s of a rectangular cross-section that is orthogonal to the central axis 100c is denoted by a, a length of a long side 101f is denoted by b, and a height of the vibrator 101 along the central axis 100c is denoted by c. In the following explanation, a height direction of the vibrator 101 is assumed to be a direction of vibrations in the longitudinal primary vibration mode as well as an axis direction of torsion in the torsional vibration. Moreover, a, b, and c satisfy a<b<c.

A resonance frequency in the longitudinal primary vibration mode and a resonance frequency in the torsional secondary vibration mode, or the resonance frequency in the longitudinal primary vibration mode and a resonance frequency in the torsional tertiary vibration mode can be matched by appropriately choosing a, b, and c in the vibrator 101.

Figure 2E:
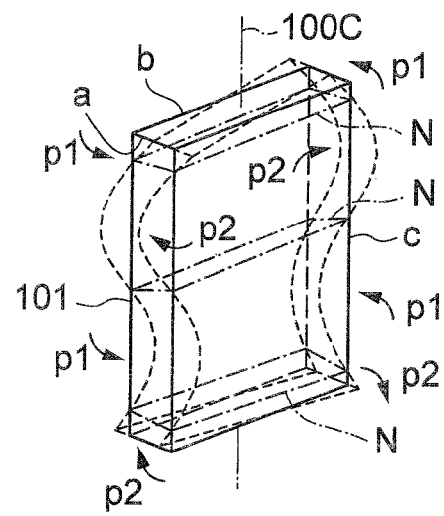
FIG. 2E is a perspective view that depicts with a dotted line a vibration state of the vibrator in a torsional tertiary vibration mode.

In FIGS. 2B to 2E, directions of the torsional vibration are shown by p1 and p2, a direction of the longitudinal vibration is shown by q, and a node of the vibrations is shown by N. One node N is present at central positions in a height direction in each of the torsional primary vibration mode (FIG. 2B) and the longitudinal primary vibration mode (FIG. 2C). Two nodes N are present at two positions in the height direction in the torsional secondary vibration mode (FIG. 2D). Three nodes N are present at three positions in the height direction in the torsional tertiary vibration mode (FIG. 2E).

In FIGS. 2B to 2E, a continuous line is used to show a shape of the vibrator 101 before it is subjected to vibrations and a dotted line is used to show a shape of the vibrator 101 after it is subjected to vibrations.

Figure 3:
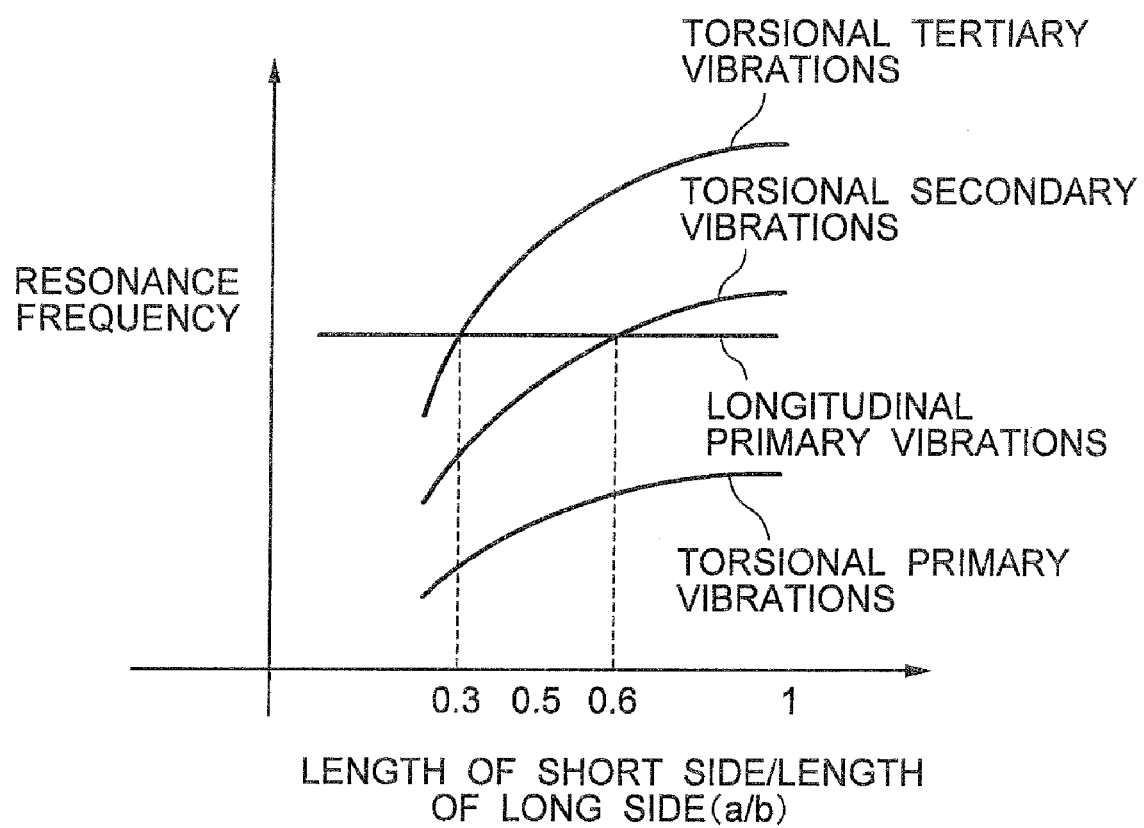
FIG. 3 is a graph that depicts resonance frequencies of each of the modes when a height of the vibrator is fixed and a parameter represented by a length of a short side/a length of a long side is plotted on an axis of abscissa.

As can be seen in FIG. 3, when a parameter a/b is varied, although the resonance frequency of the longitudinal primary vibration mode stays constant without depending on the parameter a/b, the resonance frequencies of the torsional vibration increase with an increase in the parameter a/b.

Furthermore, the resonance frequency of the torsional primary vibration mode never matches with the resonance frequency of the longitudinal primary vibration mode irrespective of the value of the parameter a/b. On the contrary, the resonance frequency of the torsional secondary vibration mode matches with the resonance frequency of the longitudinal primary vibration mode near a position where the parameter a/b is about 0.6. Moreover, the resonance frequency of the torsional tertiary vibration mode matches with the resonance frequency of the longitudinal primary vibration mode near a position where the parameter a/b is about 0.3. Therefore, the lengths a and b are chosen in the vibrator 101 according to the first embodiment such that the parameter a/b falls between 0.25 and 0.35 in the longitudinal primary vibration and the torsional tertiary vibration, and falls between 0.55 and 0.65 in the longitudinal primary vibration and the torsional secondary vibration. In a multilayered piezoelectric element 120 shown in FIG. 6, the parameter a/b is set to approximately 0.3.

In the ultrasonic motor 100, an elliptical vibration is generated by combining a longitudinal primary resonance vibration resulting from an expansion and a contraction of the vibrator 101 along the central axis 100c (rotation axis) and a torsional secondary resonance vibration or a torsional tertiary resonance vibration resulting from twisting of the vibrator 101 around the central axis 100c as a torsional axis. A ratio (proportion) of the lengths a and b is chosen such that the resonance frequencies of the longitudinal primary resonance vibration resulting from the expansion and the contraction of the vibrator 101 along the central axis 100c and the torsional secondary resonance vibration or the torsional tertiary resonance vibration resulting from twisting of the vibrator 101 around the central axis 100c as the torsional axis almost match.

The vibrator 101 includes the multilayered piezoelectric element 120 in which a plurality of piezoelectric sheets is stacked. The longitudinal primary resonance vibration and the torsional secondary resonance vibration or the torsional tertiary resonance vibration are generated in the vibrator 101 because of formation of activated regions by polarization in a thickness direction of the piezoelectric sheets.

Figure 4:
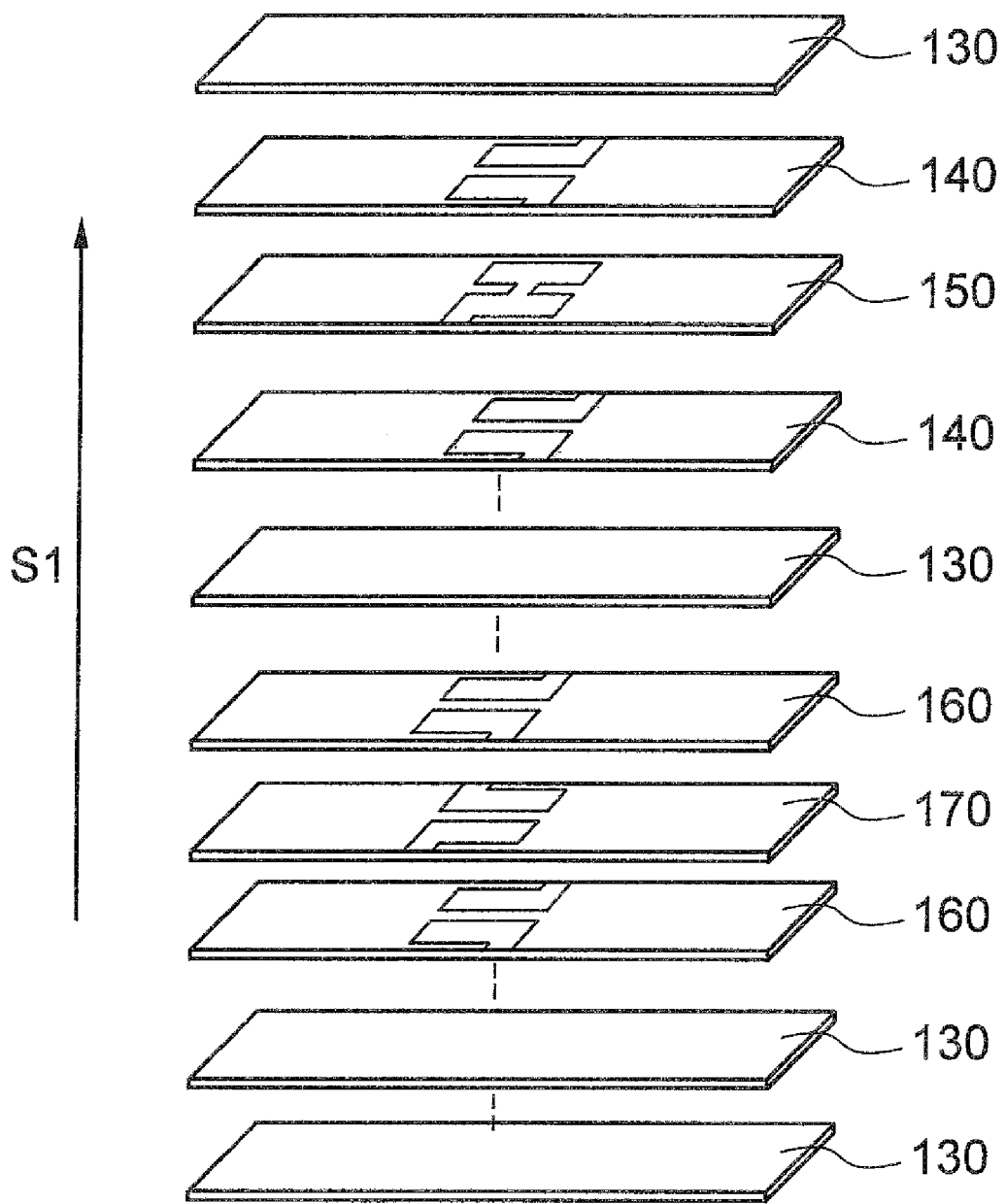
FIG. 4 is an exploded perspective view of a structure of a multilayered piezoelectric element according to the first embodiment.
Figure 5A:
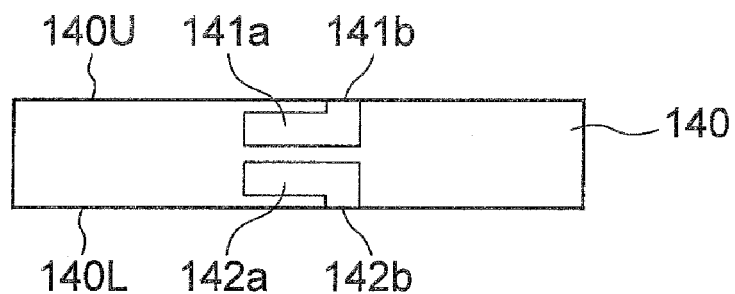
FIG. 5A is a plan view of a structure of a second piezoelectric sheet.
Figure 5B:
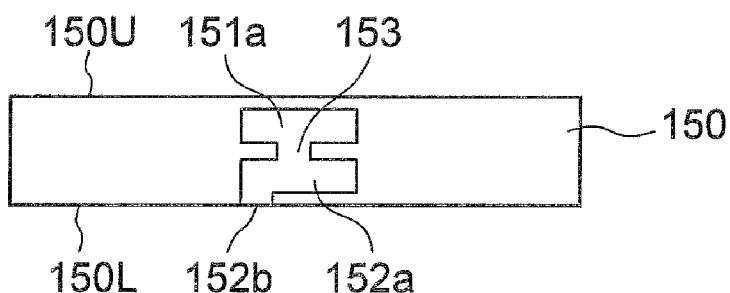
FIG. 5B is a plan view of a structure of a third piezoelectric sheet.
Figure 5C:
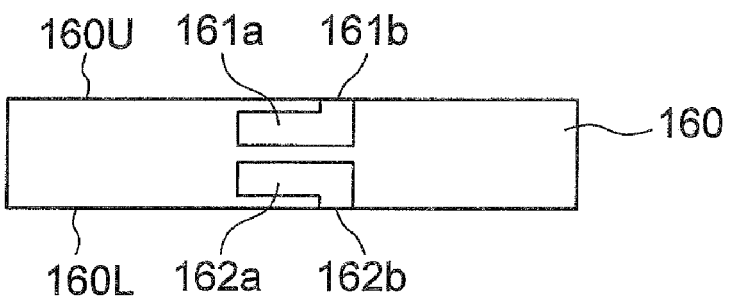
FIG. 5C is a plan view of a structure of a fourth piezoelectric sheet.
Figure 5D:
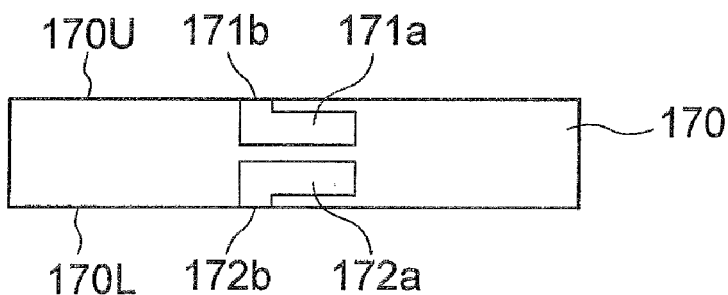
FIG. 5D is a plan view of a structure of a fifth piezoelectric sheet according to the first embodiment.
Figure 6:
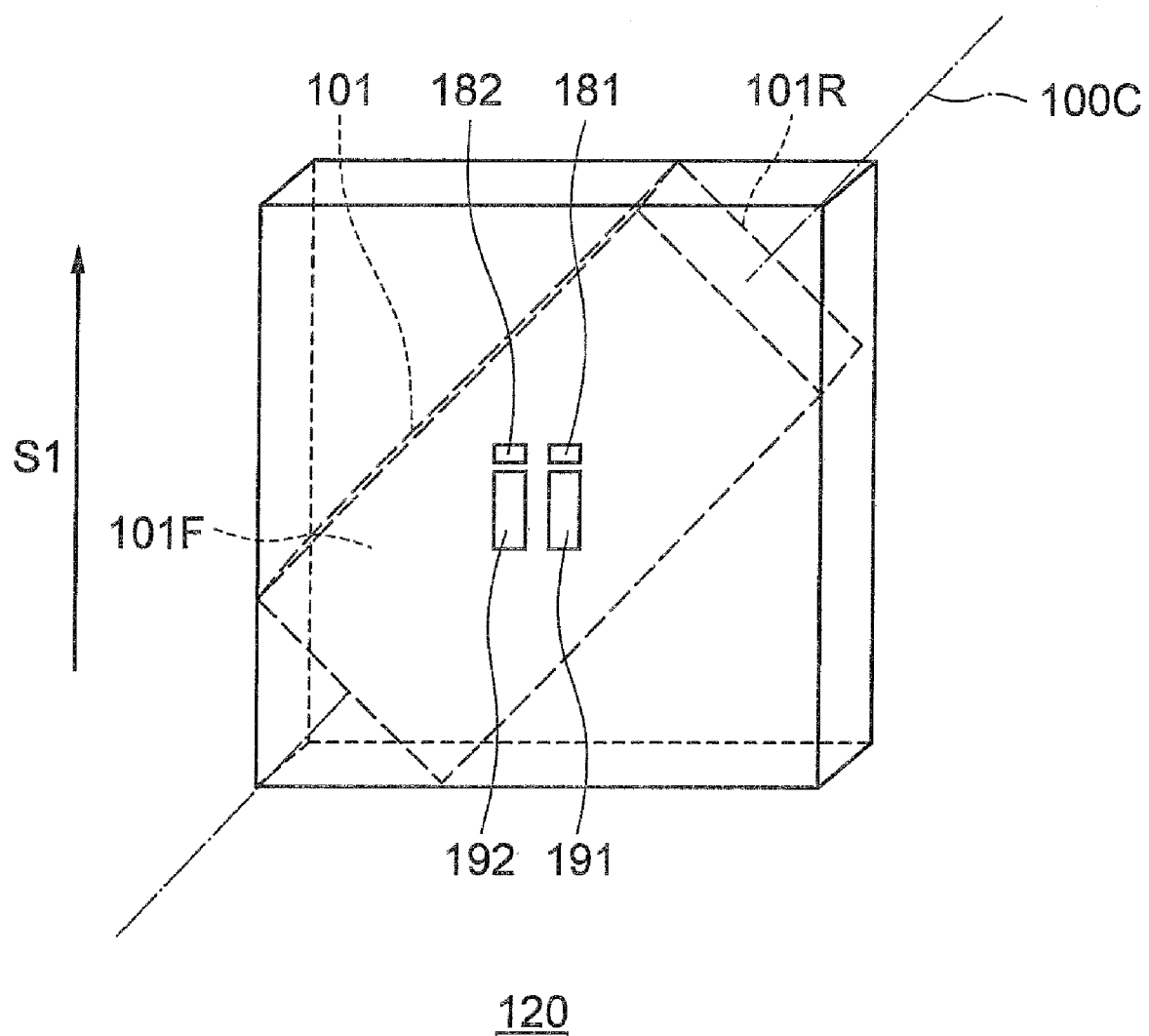
FIG. 6 is a perspective view that depicts a position at which the vibrator is cut from the multilayered piezoelectric element according to the first embodiment.
Figure 7A:
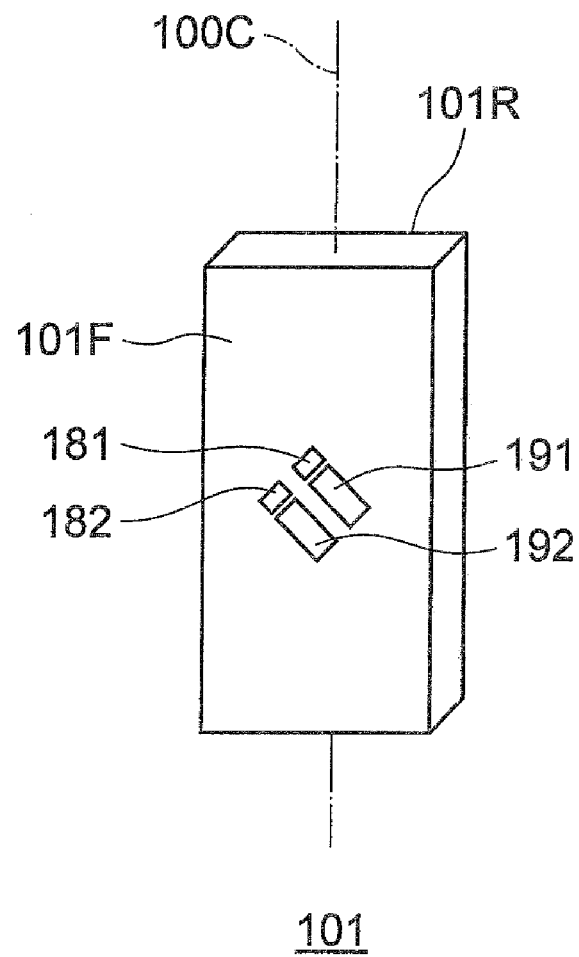
FIG. 7A is a perspective view, from an upper front side, of a structure of the vibrator cut from the multilayered piezoelectric element according to the first embodiment
Figure 7B:
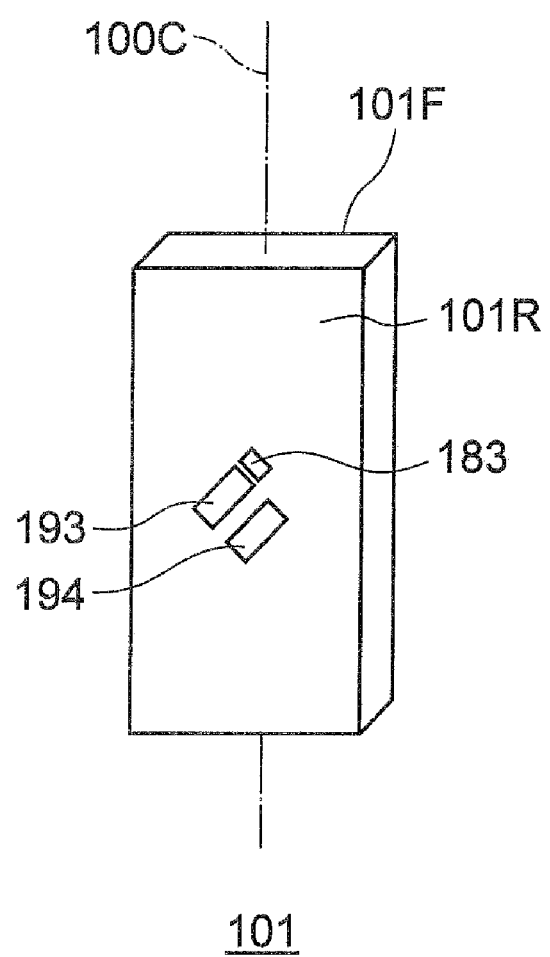
FIG. 7B is a perspective view, from an upper rear side, of a structure of the vibrator.

Structures of the vibrator 101 and the multilayered piezoelectric element 120 are explained below with reference to FIGS. 4 to 7B. FIG. 4 is an exploded perspective view of the structure of the multilayered piezoelectric element 120. FIG. 5A is a plan view of a structure of a second piezoelectric sheet 140, FIG. 5B is a plan view of a structure of a third piezoelectric sheet 150, FIG. 5C is a plan view of a structure of a fourth piezoelectric sheet 160, and FIG. 5D is a plan view of a structure of a fifth piezoelectric sheet 170. FIG. 6 is a perspective view that depicts a position at which the vibrator 101 is cut from the multilayered piezoelectric element 120. FIG. 7A is a perspective view, from an upper front side, of the structure of the vibrator 101 cut from the multilayered piezoelectric element 120 according to the first embodiment and FIG. 7B is a perspective view, from an upper rear side, of the structure of the vibrator 101. In FIG. 6, internal electrodes are transparently shown. In FIGS. 6 to 7B, a detailed stacking state of each of the piezoelectric sheets is omitted.

As shown in FIG. 4, the multilayered piezoelectric element 120 includes, stacked from the top in the height direction (a direction indicated by an arrow S1 in FIG. 4), (i) a plurality of first piezoelectric sheets 130, (ii) a plurality of the second piezoelectric sheets 140 and a plurality of the third piezoelectric sheets 150, which are stacked alternately, (iii) a plurality of the first piezoelectric sheets 130, (iv) a plurality of the fourth piezoelectric sheets 160 and a plurality of the fifth piezoelectric sheets 170, which are stacked alternately, and (v) a plurality of the first piezoelectric sheets 130.

The number and arrangement of the piezoelectric sheets included in the multilayered piezoelectric element 120 can be changed depending on the specification of the vibrator 101.

As shown in FIGS. 5A to 5D, the second piezoelectric sheet 140, the third piezoelectric sheet 150, the fourth piezoelectric sheet 160, and the fifth piezoelectric sheet 170 have an identical shape of a rectangular plate. The first piezoelectric sheet 130 also has the same rectangular plate shape as that of the second piezoelectric sheet 140, the third piezoelectric sheet 150, the fourth piezoelectric sheet 160, and the fifth piezoelectric sheet 170.

As the first piezoelectric sheet 130, the second piezoelectric sheet 140, the third piezoelectric sheet 150, the fourth piezoelectric sheet 160, and the fifth piezoelectric sheet 170, for example, hard-type lead zirconate titanate piezoelectric elements are used. These piezoelectric ceramic sheets should preferably be made from a PZT material having a thickness of 10 micrometers ($\mu$m) to 100 $\mu$m. The internal electrodes are formed of, for example, silver-palladium (Ag—Pd) alloy having a thickness of approximately 4 $\mu$m. The second piezoelectric sheet 140, the third piezoelectric sheet 150, the fourth piezoelectric sheet 160, and the fifth piezoelectric sheet 170 include internal electrodes and an activated region polarized in the thickness direction.

Concrete structures of the internal electrodes and external electrodes are explained below.

Two internal electrodes are formed by way of printing on an upper surface of the second piezoelectric sheet 140, the third piezoelectric sheet 150, the fourth piezoelectric sheet 160, and the fifth piezoelectric sheet 170.

As shown in FIG. 5A, around a center of long sides (vertical sides in FIGS. 5A to 5D) of the second piezoelectric sheet 140, a first internal electrode 141a (D+) and a second internal electrode 142a (C+) forming a vibration detecting electrode layer for detecting the vibrations are arranged facing but isolated from each other. Furthermore, a description within parentheses given after the internal electrode indicates the name and a polarity of the electrode layer (described later) constituted by the internal electrodes.

The first internal electrode 141a (D+) and the second internal electrode 142a (C+) are extended such that their protrusions 141b and 142b are, respectively, exposed to long sides 140U and 140L of the second piezoelectric sheet 140. Moreover, the protrusions 141b and 142b are aligned at positions facing each other along the long sides of the second piezoelectric sheet 140.

As shown in FIG. 5B, around a center of long sides of the third piezoelectric sheet 150, a third internal electrode 151a (D−) and a fourth internal electrode 152a (C−) forming a vibration detecting electrode layer for detecting the vibrations are arranged facing each other. The third internal electrode 151a (D−) and the fourth internal electrode 152a (C−) are short circuited to each other with a connecting electrode 153 arranged therebetween.

The fourth internal electrode 152a (C−) is extended such that its protrusion 152b is exposed to a long side 150L of the third piezoelectric sheet 150.

As shown in FIG. 5C, around a center of long sides of the fourth piezoelectric sheet 160, a fifth internal electrode 161a (B+) and a sixth internal electrode 162a (A+) forming a driving electrode layer for driving are arranged facing but isolated from each other. The fifth internal electrode 161a (B+) and the sixth internal electrode 162a (A+) are extended such that their protrusions 161b and 162b are, respectively, exposed to long sides 160U and 160L of the fourth piezoelectric sheet 160. Moreover, the protrusions 161b and 162b are aligned at positions facing each other along the long sides of the fourth piezoelectric sheet 160.

As shown in FIG. 5D, around a center of long sides of the fifth piezoelectric sheet 170, a seventh internal electrode 171a (B−) and an eighth internal electrode 172a (A−) forming a driving electrode layer for driving are arranged facing but isolated from each other.

The seventh internal electrode 171a (B−) and the eighth internal electrode 172a (A−) are extended such that their protrusions 171b and 172b are, respectively, exposed to long sides 170U and 170L of the fifth piezoelectric sheet 170. Moreover, the protrusions 171b and 172b are aligned at positions facing each other along the long sides of the fifth piezoelectric sheet 170.

The first internal electrode 141a (D+) and the third internal electrode 151a (D−), and the second internal electrode 142a (C+) and the fourth internal electrode 152a (C−) are formed on the positions facing each other when the second piezoelectric sheet 140 and the third piezoelectric sheet 150 are stacked. The first internal electrode 141a (D+) and the third internal electrode 151a (D−), and the second internal electrode 142a (C+) and the fourth internal electrode 152a (C−), respectively, form polarized regions for detecting the vibrations. These polarized regions are vibration detecting electrode layers and, respectively, denoted as Phase D and Phase C.

The fifth internal electrode 161a (B+) and the seventh internal electrode 171a (B−), and the sixth internal electrode 162a (A+) and the eighth internal electrode 172a (A−) are formed on the positions facing each other when the fourth piezoelectric sheet 160 and the fifth piezoelectric sheet 170 are stacked. The fifth internal electrode 161a (B+) and the seventh internal electrode 171a (B−), and the sixth internal electrode 162a (A+) and the eighth internal electrode 172a (A−), respectively, form polarized regions for driving. These polarized regions are driving electrode layers and, respectively, denoted as Phase B and Phase A.

The external electrodes are formed on the protrusions 141b, 142b, 152b, 161b, 162b, 171b, and 172b of the internal electrodes, for example, by way of printing of silver paste.

A first external electrode 181 (C+: + electrode of Phase C) is formed on a front face 101F of the vibrator 101 so as to short circuit the protrusion 142b of each piezoelectric sheet 140 and a second external electrode 182 (CD−: common− electrode of Phase C and Phase D) is formed on the front face 101F of the vibrator 101 so as to short circuit the protrusion 152b of each piezoelectric sheet 150 (FIG. 7A).

A third external electrode 183 (D+) is formed on a rear face 101R of the vibrator 101 so as to short circuit the protrusion 141b of each piezoelectric sheet 140 (FIG. 7B). The first external electrode 181 (C+) and the third external electrode 183 (D+) are external electrodes that are connected to the vibration detecting electrode layer (phase C or phase D). These external electrodes are connected to an external detector (not shown) of the ultrasonic motor 100. As an example, an FPC (flexible print circuit) is used for connection and one end of the FPC is connected to each electrode group. The second external electrode 182 (CD−) is used only during polarization and it is not connected when the ultrasonic motor 100 is being driven.

On the other hand, a fourth external electrode 191 (A+) is formed on the front face 101F of the vibrator 101 so as to short circuit the protrusion 162b of each piezoelectric sheet 160, and a fifth external electrode 192 (A−) is formed on the front face 101F of the vibrator 101 so as to short circuit the protrusion 172b of each piezoelectric sheet 170. Furthermore, a sixth external electrode 193 (B+) is formed on the rear face 101R of the vibrator 101 so as to short circuit the protrusion 161b of each piezoelectric sheet 160, and a seventh external electrode 194 (B−) is formed on the rear face 101R of the vibrator 101 so as to short circuit the protrusion 171b of each piezoelectric sheet 170.

The fourth external electrode 191 (A+), the fifth external electrode 192 (A−), the sixth external electrode 193 (B+), and the seventh external electrode 194 (B−) are external electrodes that are connected to the driving electrode layer (Phase A or Phase B). These external electrodes are connected to an external power source (not shown) of the ultrasonic motor 100. As an example, an FPC is used for connection and one end of the FPC is connected to each electrode group.

The external electrodes are not shown in FIGS. 1 to 2E.

As shown in FIGS. 6 and 7A, the first external electrode 181 (C+), the second external electrode 182 (CD−), the fourth external electrode 191 (A+), and the fifth external electrode 192 (A−) are formed on the front face 101F that is one of the side faces of the surface formed by stacking the first piezoelectric sheet 130, the second piezoelectric sheet 140, the third piezoelectric sheet 150, the fourth piezoelectric sheet 160, and the fifth piezoelectric sheet 170. On the other hand, as shown in FIG. 7B, the third external electrode 183 (D+), the sixth external electrode 193 (B+), and the seventh external electrode 194 (B−) are formed on the rear face 101R that is the other side face.

The vibrator 101 is formed by cutting the multilayered piezoelectric element 120 in a direction in which the central axis 100c is inclined by a predetermined angle relative to the stacking direction indicated by the arrow S1 of the first piezoelectric sheet 130, the second piezoelectric sheet 140, the third piezoelectric sheet 150, the fourth piezoelectric sheet 160, and the fifth piezoelectric sheet 170. A long side on one side of the first piezoelectric sheet 130 and the long sides 140U, 150U, 160U, and 170U on one side of the second piezoelectric sheet 140, the third piezoelectric sheet 150, the fourth piezoelectric sheet 160, and the fifth piezoelectric sheet 170 are aligned and a side face to which each external electrode group is exposed forms the front face 101F. Moreover, a long side on the other side of the first piezoelectric sheet 130 and the long sides 140L, 150L, 160L, and 170L on the other side of the second piezoelectric sheet 140, the third piezoelectric sheet 150, the fourth piezoelectric sheet 160, and the fifth piezoelectric sheet 170 are aligned and a side face to which each external electrode group is exposed forms the rear face 101R. The friction contact members 103a and 103b are fixed using an adhesive to an upper surface of the cut vibrator 101.

It is preferable that the vibrator 101 be cut from the multi-layered piezoelectric element 120 at an angle of 45° relative to the stacking direction indicated by the arrow S1 (FIG. 6). When the longitudinal vibration is to be made stronger, the vibrator 101 can be cut at an angle less than 45° in the stacking direction indicated by the arrow S1 and when the torsional vibration is to be made stronger, the vibrator 101 can be cut at an angle greater than 45° relative to the stacking direction indicated by the arrow S1.

Phase A and Phase B that are the driving electrode layers are arranged at positions that correspond to the common nodal positions of the longitudinal primary resonance vibration (FIG. 2C) and the torsional tertiary resonance vibration (FIG. 2E) of the cut vibrator 101, and include a central portion of the vibrator 101 in the long sides (in a direction of the central axis 100c) where the stress during vibration is maximum.

On the contrary, Phase C and Phase D that are the vibration detecting electrode layers are arranged on extended lines in the stacking direction indicated by the arrow S1 of Phase A and Phase B that are the driving electrode layers.

Operations

If a predetermined AC voltage is applied to Phase A and Phase B of the ultrasonic motor 100 that uses the vibrator 101 of the structure described above, a vibration having a displacement component in a diagonal direction within the front face 101F and the rear face 101R of the vibrator 101 is generated.

If the AC voltage of the same phase is applied to Phase A and Phase B with a frequency corresponding to the resonance frequency of the longitudinal primary vibration or the torsional tertiary vibration of the vibrator 101, piezoelectric elements of Phase A and Phase B vibrate in the same phase. As a result, the vibrator 101 vibrates longitudinally. At this time, a potential of the same phase is generated with the same vibrational amplitude in regions of Phase C and Phase D that are the vibration detecting electrode layers. On the contrary, if the AC voltage of opposite phases) (180° is applied to Phase A and Phase B with the same frequency, the piezoelectric elements of Phase A and Phase B vibrate in reverse phases. As a result, the vibrator 101 vibrates torsionally. At this time, a potential of reverse phase is generated with the same vibrational amplitude in regions of Phase C and Phase D that are the vibration detecting electrode layers.

The longitudinal primary vibration and the torsional tertiary vibration of the vibrator 101 are simultaneously excited by applying the AC voltage having phases different from each other (for example, a phase difference of 90°) to Phase A and Phase B of the vibrator 101. Due to this, elliptical vibrations are generated on the elliptical vibration generating surface 101a that is the upper end face of the vibrator 101, and the rotor 102 that is pressed and held by the vibrator 101 is rotated. Furthermore, a rotation direction of the elliptical vibrations generated in the vibrator 101 can be reversed by reversing the phase difference of the AC voltage applied to Phase A and Phase B. Thus, the rotation direction of the rotor 102 can be controlled.

As described above, in the regions of Phase C and Phase D that are the vibration detecting electrode layers, the potential of the same phase is generated in the longitudinal primary resonance vibration mode, and the potential of the reverse phases is generated with the same vibrational amplitude in the torsional tertiary resonance vibration mode. Thus, in the state in which the longitudinal primary resonance vibration and the torsional tertiary resonance vibration are simultaneously excited, by calculating the difference between the potentials generated in the regions of Phase C and Phase D, a longitudinal primary resonance vibration component that is an in-phase component can be cancelled and a torsional tertiary resonance vibration component only can be detected. For example, a vibration detecting signal, which is proportional to the vibrational amplitude and phase of the torsional tertiary vibration generated on the vibrator 101, can be obtained by connecting the external electrode C− and external electrode D− to pick up a difference in potential between the external electrode C+ and external electrode D+.

It is known that a phase difference between the vibration detecting signal, which is obtained from the vibration detecting electrode layer in above mentioned manner, and the AC voltage applied to the driving electrode layer is a predetermined phase difference when the torsional tertiary resonance vibration is generated. By controlling the driving frequency so as to hold the phase difference to be the predetermined phase difference, the vibrator can be driven in a frequency around the resonance frequency, thereby the vibrator can be driven efficiently and stably.

Incidentally, detail description about the technique relating to a frequency tracking is omitted because the technique itself relating to the frequency tracking based on the vibration detecting signal is not involved in the characterizing portion of the present invention.

The third internal electrode 151a (D−) and the fourth internal electrode 152a (C−) of the third piezoelectric sheet 150 forming the vibration detecting electrode layer are made internally mutually conductive with the connecting electrode 153. Due to this, the torsional tertiary resonance vibration component that is the difference between the potentials generated in the regions of Phase C and Phase D occurs between the first external electrode 181 (C+) and the third external electrode 183 (D+) without using an external wiring connection.

Effect

In the ultrasonic motor 100 described above, because the vibrator 101 is formed with a single member, the structure of the vibrator 101 can be simplified. The third internal electrode 151a (D−) and the fourth internal electrode 152a (C−) that are the internal electrodes for detecting the vibrations are made mutually conductive with the connecting electrode 153, thus forming a conductive layer. Therefore, a torsional resonance vibration component required for tracking the frequency can be easily detected without providing wiring externally for connection between the third internal electrode 151a (D−) and the fourth internal electrode 152a (C−). Furthermore, because the number of wirings that need to be connected to the vibrator 101 when the motor is being driven can be reduced, it is beneficial for downsizing the motor. Because a signal detecting the torsional resonance vibration component is a signal from the vibration detecting electrode layers that are connected in series, a signal voltage can be increased. Thus, it is beneficial when the motor is being driven at a low speed, that is, when a vibration speed is reduced.

A polarity direction of Phase C and Phase D that are the vibration detecting electrode layers can be reversed. In this case, the longitudinal primary resonance vibration component that is the sum of the potentials generated in the regions of Phase C and Phase D can be made to occur between the first external electrode 181 (C+) and the third external electrode 183 (D+).

Figure 8A:
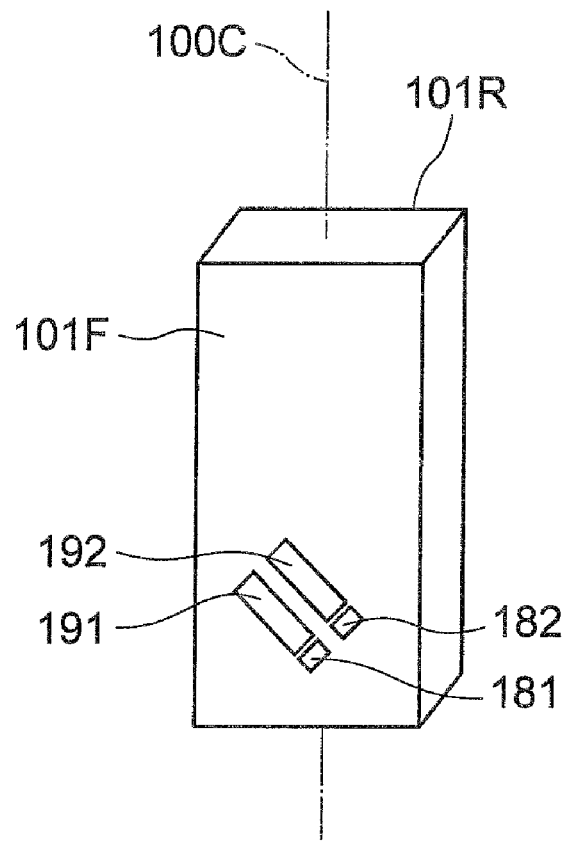
FIG. 8A is a perspective view, from an upper front side, of a structure of a vibrator according to a modification of the first embodiment
Figure 8B:
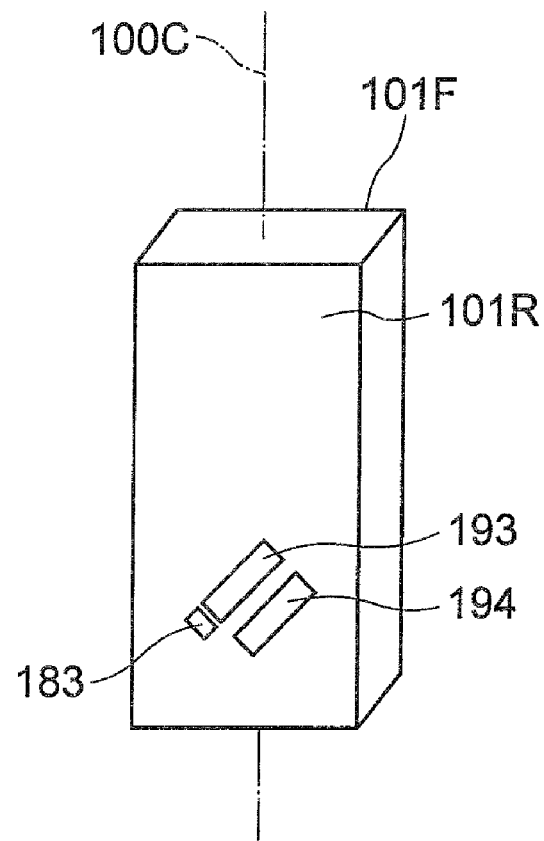
FIG. 8B is a perspective view, from an upper rear side, of a structure of the vibrator.

FIG. 8A is a perspective view, from an upper front side, of a structure of a vibrator according to a modification of the first embodiment and FIG. 8B is a perspective view, from an upper rear side, of the structure of the vibrator. The vibrator shown in FIGS. 8A and 8B is a longitudinal primary torsional secondary resonance vibrator formed such that a dimension ratio of long sides (a) and short sides (b) of a rectangle in a cross-section orthogonal to the central axis 100c of the multilayered piezoelectric element is approximately 0.6. In the vibrator, the driving electrode layer is provided on a position including the node portion of the torsional secondary resonance vibration, and the vibration detecting electrode layer is provided on an extended line of the stacking direction of the driving electrode layer. The same effect as that of the vibrator 101 shown in FIGS. 1 to 73 can be obtained with the vibrator according to the modification of the first embodiment.

Second Embodiment

In an ultrasonic motor according to a second embodiment, the vibration detecting electrode layers in a vibrator are formed at different positions from that of the ultrasonic motor according to the first embodiment. Rest of the structure is similar to that of the ultrasonic motor according to the first embodiment and detailed explanation of the structure other than the vibrator is omitted.

Figure 9:
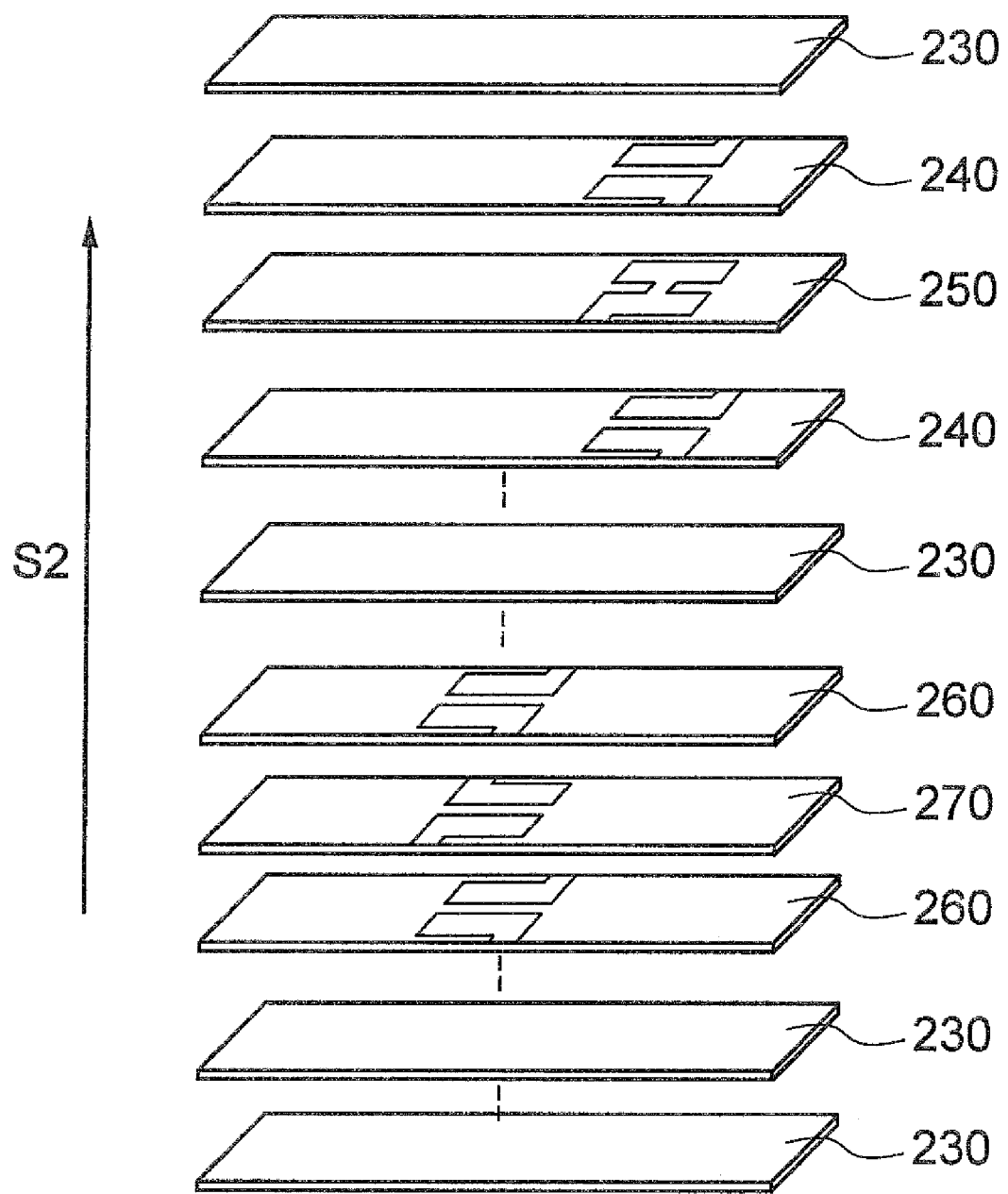
FIG. 9 is an exploded perspective view of a structure of a multilayered piezoelectric element according to a second embodiment.
Figure 10A:
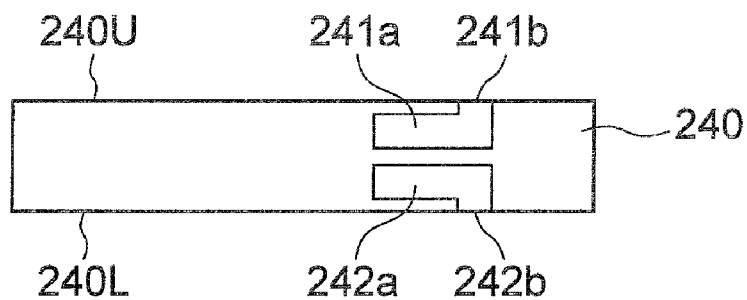
FIG. 10A is a plan view of a structure of a second piezoelectric sheet.
Figure 10B:
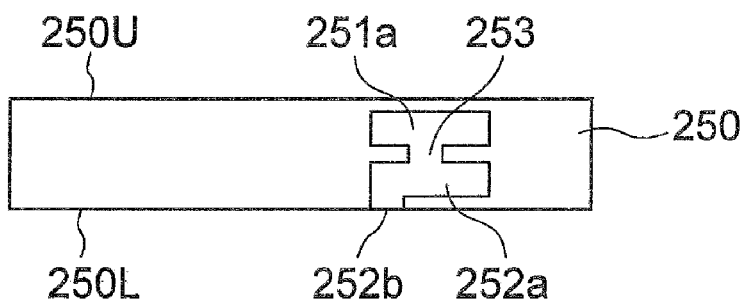
FIG. 10B is a plan view of a structure of a third piezoelectric sheet.
Figure 10C:
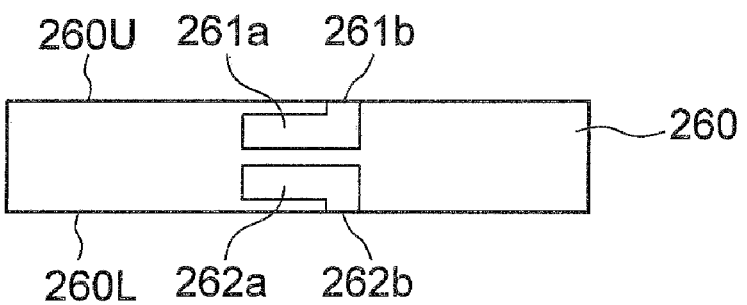
FIG. 10C is a plan view of a structure of a fourth piezoelectric sheet.
Figure 10D:
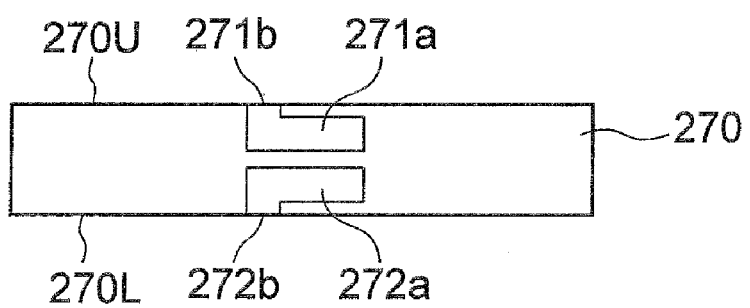
FIG. 10D is a structure of a fifth piezoelectric sheet according to the second embodiment.
Figure 11:
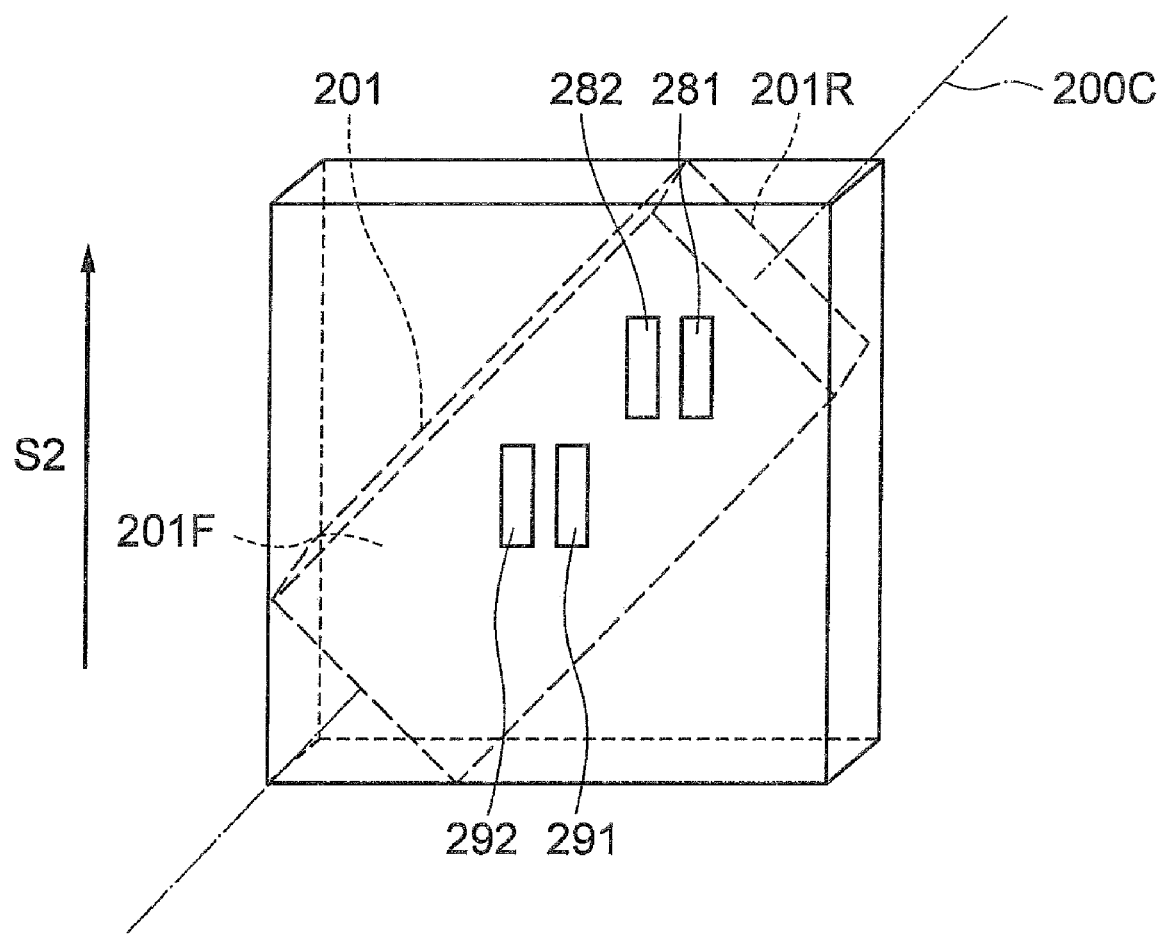
FIG. 11 is a perspective view that depicts a position at which the vibrator is cut from the multilayered piezoelectric element according to the second embodiment.
Figure 12A:
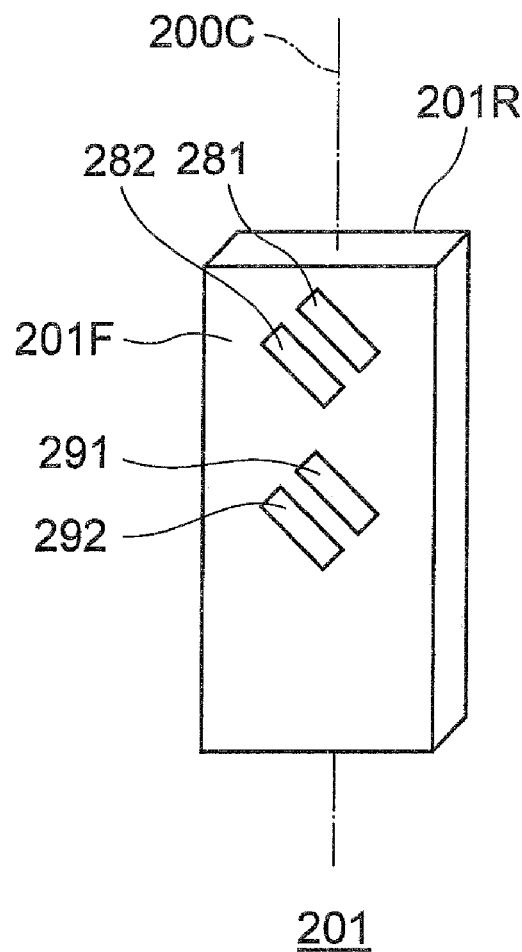
FIG. 12A is a perspective view, from an upper front side, of a structure of the vibrator cut from the multilayered piezoelectric element according to the second embodiment
Figure 12B:
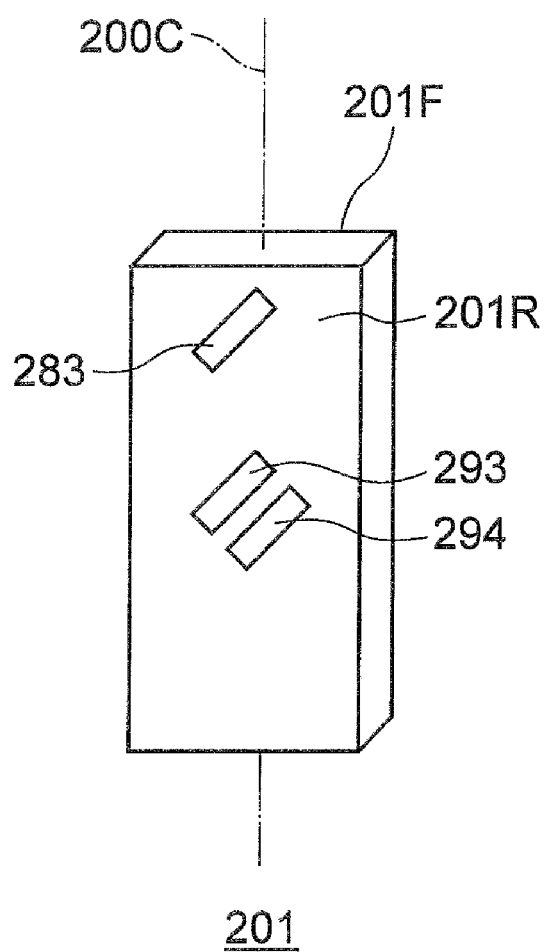
FIG. 12B is a perspective view, from an upper rear side, of a structure of the vibrator.

Structures of a vibrator 201 and a multilayered piezoelectric element 220 are explained below with reference to FIGS. 9 to 12E. FIG. 9 is an exploded perspective view of the structure of the multilayered piezoelectric element 220 according to the second embodiment. FIG. 10A is a plan view of a structure of a second piezoelectric sheet 240, FIG. 10B is a plan view of a structure of a third piezoelectric sheet 250, FIG. 10C is a plan view of a structure of a fourth piezoelectric sheet 260, and FIG. 10D is a plan view of a structure of a fifth piezoelectric sheet 270. FIG. 11 is a perspective view that depicts a position at which the vibrator 201 is cut from the multilayered piezoelectric element 220. FIG. 12A is a perspective view, from an upper front side, of the structure of the vibrator 201 cut from the multilayered piezoelectric element 220 according to the second embodiment and FIG. 12B is a perspective view, from an upper rear side, of the structure of the vibrator 201. In FIGS. 10A to 10D, internal electrodes are transparently shown. In FIGS. 10A to 11, a detailed stacking state of each of the piezoelectric sheets is omitted.

As shown in FIG. 9, the multilayered piezoelectric element 220 includes, similar to that of the multilayered piezoelectric element 120 according to the first embodiment, stacked from the top in a height direction (a direction indicated by an arrow S2 in FIG. 9), (i) a plurality of first piezoelectric sheets 230, (ii) a plurality of the second piezoelectric sheets 240 and a plurality of the third piezoelectric sheets 250, which are stacked alternately, (iii) a plurality of the first piezoelectric sheets 230, (iv) a plurality of the fourth piezoelectric sheets 260 and a plurality of the fifth piezoelectric sheets 270, which are stacked alternately, and (v) a plurality of the first piezoelectric sheets 230.

As shown in FIGS. 10A to 10D, the second piezoelectric sheet 240, the third piezoelectric sheet 250, the fourth piezoelectric sheet 260, and the fifth piezoelectric sheet 270 have an identical shape of a rectangular plate. The first piezoelectric sheet 230 also has the same rectangular plate shape as that of the second piezoelectric sheet 240, the third piezoelectric sheet 250, the fourth piezoelectric sheet 260, and the fifth piezoelectric sheet 270. A material used in these piezoelectric sheets and characteristics of the piezoelectric sheets are similar to that of the piezoelectric sheets in the first embodiment.

Internal electrodes and external electrodes are formed by a method similar to that of the first embodiment.

As shown in FIG. 10A, on a right side of long sides (vertical sides in FIGS. 10A to 10D) of the second piezoelectric sheet 240, a first internal electrode 241a (D+) and a second internal electrode 242a (C+) forming a vibration detecting electrode layer for detecting the vibrations are arranged facing but isolated from each other.

The first internal electrode 241a (D+) and the second internal electrode 242a (C+) are extended such that their protrusions 241b and 242b are, respectively, exposed to long sides 240U and 240L of the second piezoelectric sheet 240. Moreover, the protrusions 241b and 242b are aligned at positions facing each other along the long sides of the second piezoelectric sheet 240.

As shown in FIG. 10B, on a right side of long sides of the third piezoelectric sheet 250, a third internal electrode 251a (D−) and a fourth internal electrode 252a (C−) forming a vibration detecting electrode layer for detecting the vibrations are arranged facing each other. The third internal electrode 251a (D−) and the fourth internal electrode 252a (C−) are short circuited to each other with a connecting electrode 253 arranged therebetween.

The fourth internal electrode 252a (C−) is extended such that its protrusion 252b is exposed to a long side 250L of the third piezoelectric sheet 250.

The first internal electrode 241a (D+) and the third internal electrode 251a (D−), and the second internal electrode 242a (C+) and the fourth internal electrode 252a (C−) are formed on the positions facing each other when the second piezoelectric sheet 240 and the third piezoelectric sheet 250 are stacked. The first internal electrode 241a (D+) and the third internal electrode 251a (D−), and the second internal electrode 242a (C+) and the fourth internal electrode 252a (C−), respectively, form polarized regions for detecting the vibrations. These polarized regions are vibration detecting electrode layers and, respectively, denoted as Phase D and Phase C.

The fourth piezoelectric sheet 260 has the same structure as that of the fourth piezoelectric sheet 160 of the first embodiment. Long sides 260U and 260L of the fourth piezoelectric sheet 260, a fifth internal electrode 261a (B+), a protrusion 261b, a sixth internal electrode 262a (A+), and a protrusion 262b, respectively, correspond to the long sides 160U and 160L of the fourth piezoelectric sheet 160, the fifth internal electrode 161a (B+), the protrusion 161b, the sixth internal electrode 162a (A+), and the protrusion 162b of the first embodiment.

The fifth piezoelectric sheet 270 has the same structure as that of the fifth piezoelectric sheet 170 of the first embodiment. Long sides 270U and 270L of the fifth piezoelectric sheet 270, a seventh internal electrode 271a (B−), a protrusion 271b, an eighth internal electrode 272a (A−), and a protrusion 272b, respectively, correspond to the long sides 170U and 170L of the fifth piezoelectric sheet 170, the seventh internal electrode 171a (B−), the protrusion 171b, the eighth internal electrode 172a (A−), and the protrusion 172b of the first embodiment.

Similar to the first embodiment, the fifth internal electrode 261a (B+) and the seventh internal electrode 271a (B−), and the sixth internal electrode 262a (A+) and the eighth internal electrode 272a (A−) are formed on the positions facing each other when the fourth piezoelectric sheet 260 and the fifth piezoelectric sheet 270 are stacked. The fifth internal electrode 261a (B+) and the seventh internal electrode 271a (B−) and the sixth internal electrode 262a (A+) and the eighth internal electrode 272a (A−), respectively, form polarized regions for driving. These polarized regions are driving electrode layers and, respectively, denoted as Phase B and Phase A.

A first external electrode 281 (C+) is formed on a front face 201F of the vibrator 201 so as to short circuit the protrusion 242b of each piezoelectric sheet 240. Moreover, a second external electrode 282 (CD−) is formed on the front face 201F of the vibrator 201 so as to short circuit the protrusion 252b of each piezoelectric sheet 250 (FIG. 12A).

A third external electrode 283 (D+) is formed on a rear face 201R of the vibrator 201 so as to short circuit the protrusion 241b of each piezoelectric sheet 240 (FIG. 12B). The first external electrode 281 (C+) and the third external electrode 283 (D+) are external electrodes that are connected to the vibration detecting electrode layer (Phase C or Phase D).

These external electrodes are connected to the external detector (not shown) of the ultrasonic motor 100. As an example, the FPC is used for connection and one end of the FPC is connected to each electrode group. The second external electrode 282 (CD−) is used only during polarization and it is not connected when the ultrasonic motor 100 is being driven.

A fourth external electrode 291 (A+) and a fifth external electrode 292 (A−) formed on the front face 201F of the vibrator 201, respectively, correspond to the fourth external electrode 191 (A+) and the fifth external electrode 192 (A−) of the first embodiment. Furthermore, a sixth external electrode 293 (B+) and a seventh external electrode 294 (B−) formed on the rear face 201R of the vibrator 201, respectively, correspond to the sixth external electrode 193 (B+) and the seventh external electrode 194 (B−) of the first embodiment. The fourth external electrode 291 (A+), the fifth external electrode 292 (A−), the sixth external electrode 293 (B+), and the seventh external electrode 294 (B−) are driving electrode layers. These external electrodes are connected to the external power source (not shown) of the ultrasonic motor 100. As an example, the FPC is used for connection and one end of the FPC is connected to each electrode group.

Similar to the vibrator 101 according to the first embodiment, the vibrator 201 is formed by cutting the multilayered piezoelectric element 220 in a direction in which a central axis 200c is inclined by a predetermined angle relative to the stacking direction indicated by the arrow S2 of the first piezoelectric sheet 230, the second piezoelectric sheet 240, the third piezoelectric sheet 250, the fourth piezoelectric sheet 260, and the fifth piezoelectric sheet 270. A long side on one side of the first piezoelectric sheet 230 and the long sides 240U, 250U, 260U, and 270O on one side of the second piezoelectric sheet 240, the third piezoelectric sheet 250, the fourth piezoelectric sheet 260, and the fifth piezoelectric sheet 270 are aligned and a side face to which each external electrode group is exposed forms the front face 201F. Moreover, similar to the first embodiment, a long side on the other side of the first piezoelectric sheet 230 and the long sides 240L, 250L, 260L, and 270L on the other side are aligned and a side face to which each external electrode group is exposed forms the rear face 201R. The friction contact members 103a and 103b are fixed using an adhesive to an upper surface of the cut vibrator 201.

Similar to the first embodiment, Phase A and Phase B that are the driving electrode layers are arranged at positions that correspond to the common nodal positions of the longitudinal primary resonance vibration (FIG. 2C) and the torsional tertiary resonance vibration (FIG. 2E) of the vibrator 201, and includes a central portion of the vibrator 201 in the long sides (in a direction of the central axis 200c) where the stress during vibration is maximum.

On the contrary, Phase C and Phase D that are the vibration detecting electrode layers are arranged at positions that are not on extended lines in the stacking direction indicated by the arrow S2 of Phase A and Phase B that are the driving electrode layers. Specifically, Phase C and Phase D are arranged at positions including the nodal positions (positions towards a central portion that is approximately ⅙th of a length of the long sides from an upper end face or a lower end face of the vibrator 201) of the torsional tertiary vibration different from positions at which the driving electrode layers are arranged.

Effect

Because the vibration detecting electrodes are provided at nodal positions different from that of the driving electrodes, the vibration detecting electrode layers can be provided without reducing the number of layers of the driving electrodes. Furthermore, because the vibration detecting electrode layers can be stacked at positions that include the node of the torsional tertiary vibration where the stress during torsional vibration is maximum, an output of a torsional vibration detecting signal can be increased. Thus, it is beneficial for detecting the signal when the motor is being driven at a low speed, that is, when the vibrations are reduced.

Furthermore, other structures, operations, and effect are the same as those of the first embodiment.

FIG. 13A is a perspective view, from an upper front side, of a structure of a vibrator according to a modification of the second embodiment, FIG. 13B is a perspective view, from an upper rear side, of the structure of the vibrator. The vibrator shown in FIGS. 13A and 13B is a longitudinal primary torsional secondary resonance vibrator formed such that a dimension ratio of long sides (a) and short sides (b) of a rectangle in a cross-section orthogonal to the central axis 200c of the multilayered piezoelectric element is approximately 0.6. In the vibrator, the driving electrode layer is provided on the position including the node portion of the torsional secondary resonance vibration, and the vibration detecting electrode layer is provided on a position, which includes the node portion of the torsional secondary resonance vibration and is different from the position where the driving electrode layer is provided. The same effect as that of the vibrator 201 shown in FIGS. 11 to 12B can be obtained in the vibrator according to the modification of the second embodiment.

Third Embodiment

An ultrasonic motor according to the third embodiment differs from the ultrasonic motor 100 according to the first embodiment in that among external electrodes connected to driving electrode layers and vibration detecting electrode layers, all the external electrodes that need to be wired when the ultrasonic motor is being driven are formed on a front face of a multilayered piezoelectric element and the external electrodes other than these are formed on a rear face of the multilayered piezoelectric element. Rest of the structure is the same as that of the ultrasonic motor 100 according to the first embodiment and detailed explanation of the structure other than the vibrator is omitted.

Figure 14:
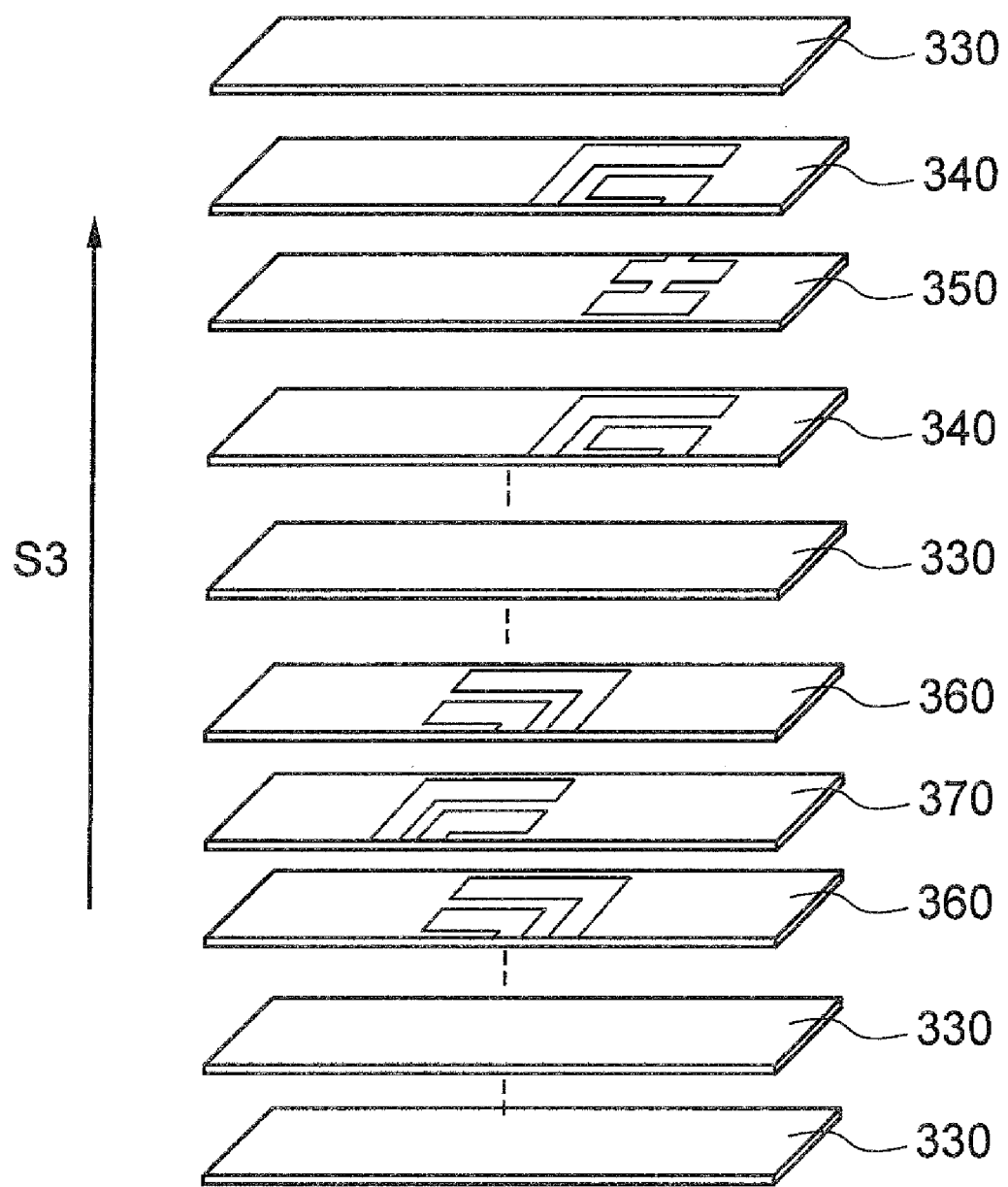
FIG. 14 is an exploded perspective view of a structure of a multilayered piezoelectric element according to a third embodiment.
Figure 15A:
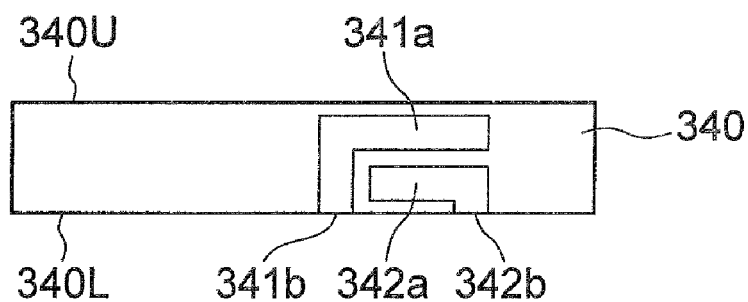
FIG. 15A is a plan view of a structure of a second piezoelectric sheet.
Figure 15B:
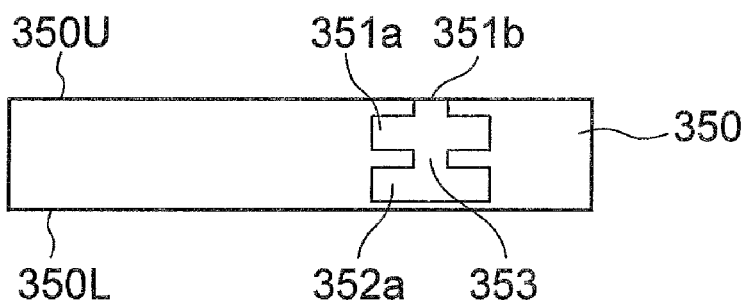
FIG. 15B is a plan view of a structure of a third piezoelectric sheet.
Figure 15C:
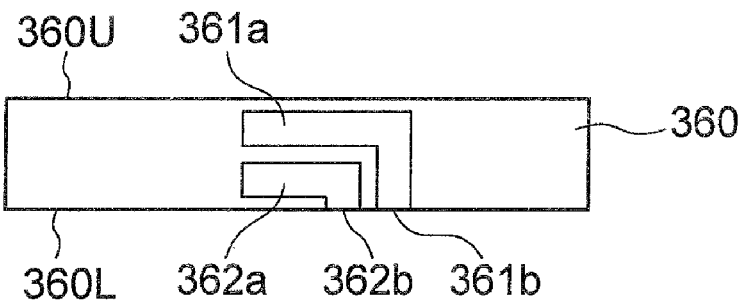
FIG. 15C is a plan view of a structure of a fourth piezoelectric sheet.
Figure 15D:
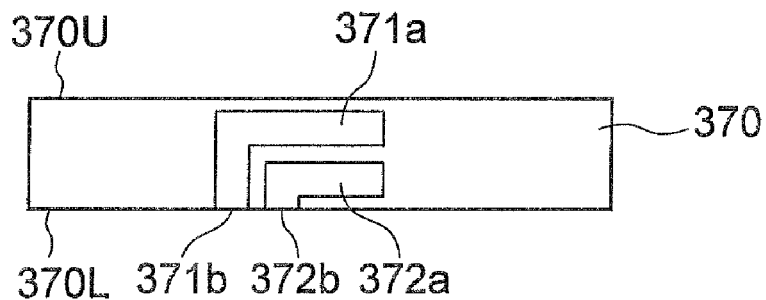
FIG. 15D is a plan view of a structure of a fifth piezoelectric sheet according to the third embodiment.
Figure 16:
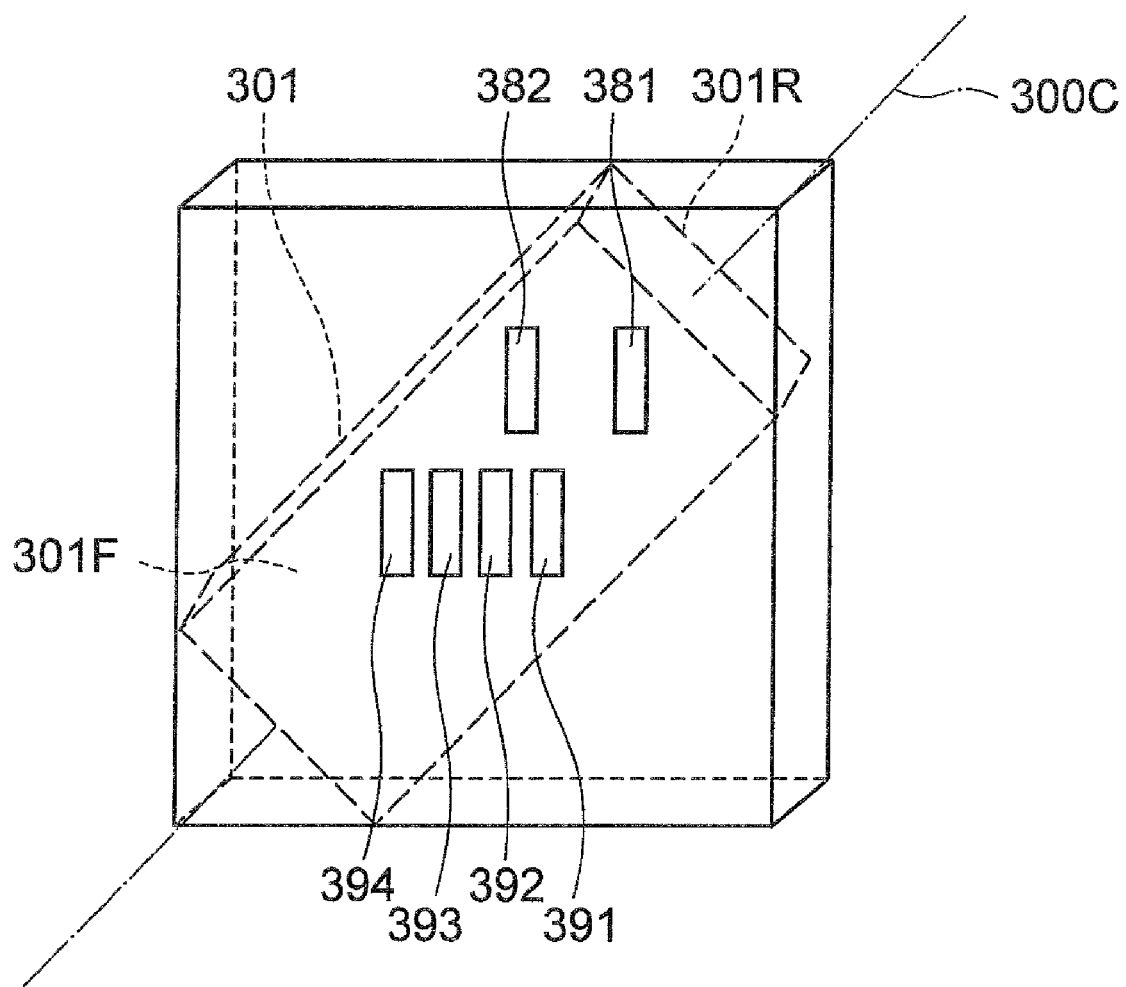
FIG. 16 is a perspective view that depicts a position at which the vibrator is cut from the multilayered piezoelectric element according to the third embodiment.

Structures of a vibrator 301 and a multilayered piezoelectric element 320 are explained below with reference to FIGS. 14 to 17B. FIG. 14 is an exploded perspective view of the structure of the multilayered piezoelectric element 320 according to the third embodiment. FIG. 15A is a plan view of a structure of a second piezoelectric sheet 340, FIG. 15B is a plan view of a structure of a third piezoelectric sheet 350, FIG. 15C is a plan view of a structure of a fourth piezoelectric sheet 360, and FIG. 15D is a plan view of a structure of a fifth piezoelectric sheet 370. FIG. 16 is a perspective view that depicts a position at which the vibrator 301 is cut from the multilayered piezoelectric element 320. FIG. 17A is a perspective view, from an upper front side, of the structure of the vibrator 301 cut from the multilayered piezoelectric element 320 according to the third embodiment and FIG. 17B is a perspective view, from an upper rear side, of the structure of the vibrator 301. In FIG. 16, internal electrodes are transparently shown. In FIGS. 16 to 17B, a detailed stacking state of each of the piezoelectric sheets is omitted.

As shown in FIG. 14, the multilayered piezoelectric element 320 includes, similar to the multilayered piezoelectric element 120 according to the first embodiment, stacked from the top in a height direction (a direction indicated by an arrow S3 in FIG. 14), (i) a plurality of first piezoelectric sheets 330, (ii) a plurality of the second piezoelectric sheets 340 and a plurality of the third piezoelectric sheets 350, which are stacked alternately, (iii) a plurality of the first piezoelectric sheets 330, (iv) a plurality of the fourth piezoelectric sheets 360 and a plurality of the fifth piezoelectric sheets 370, which are stacked alternately, and (v) a plurality of the first piezoelectric sheets 330.

As shown in FIGS. 15A to 15D, the second piezoelectric sheet 340, the third piezoelectric sheet 350, the fourth piezoelectric sheet 360, and the fifth piezoelectric sheet 370 have an identical shape of a rectangular plate. The first piezoelectric sheet 330 also has the same rectangular plate shape as that of the second piezoelectric sheet 340, the third piezoelectric sheet 350, the fourth piezoelectric sheet 360, and the fifth piezoelectric sheet 370. A material used in these piezoelectric sheets and characteristics of the piezoelectric sheets are similar to that of the piezoelectric sheets in the first embodiment.

Internal electrodes and external electrodes are formed by a method similar to that of the first embodiment.

As shown in FIG. 15A, on a right side of long sides (vertical sides in FIGS. 15A to 15D) of the second piezoelectric sheet 340, a first internal electrode 341a (D+) and a second internal electrode 342a (C+) forming a vibration detecting electrode layer for detecting the vibrations are arranged facing but isolated from each other.

The first internal electrode 341a (D+) that is arranged on a side of a long side 340U of the second piezoelectric sheet 340 and whose protrusion 341b is exposed to the other long side 340L is guided so as not to come into contact with the second internal electrode 342a (C+).

The second internal electrode 342a (C+) arranged on a side of the long side 340L is extended such that its protrusion 342b is exposed to the long side 340L of the second piezoelectric sheet 340. Thus, the protrusions 341b and 342b are arranged on the same long side 340L.

As shown in FIG. 15B, on a right side of long sides of the third piezoelectric sheet 350, a third internal electrode 351a (D−) (on a side of a long side 350U of the third piezoelectric sheet 350) and a fourth internal electrode 352a (C−) (on a side of a long side 350L facing the long side 350U) forming a vibration detecting electrode layer for detecting the vibrations are arranged facing each other. The third internal electrode 351a (D−) and the fourth internal electrode 352a (C−) are short circuited to each other with a connecting electrode 353 arranged therebetween.

The third internal electrode 351a (D−) is extended such that its protrusion 351b is exposed to the long side 350U of the third piezoelectric sheet 350.

As shown in FIG. 15C, around a center of long sides of the fourth piezoelectric sheet 360, a fifth internal electrode 361a (B+) and a sixth internal electrode 362a (A+) forming a driving electrode layer for driving are arranged facing but isolated from each other.

The fifth internal electrode 361a (B+) that is arranged on a side of a long side 360U of the fourth piezoelectric sheet 360 and whose protrusion 361b is exposed to other long side 360L is guided so as not to come into contact with the sixth internal electrode 362a (A+).

The sixth internal electrode 362a (A+) arranged on the side of the long side 360L is extended such that its protrusion 362b is exposed to the long side 360L of the fourth piezoelectric sheet 360. Thus, the protrusions 361b and 362b are arranged on the same long side 360L.

As shown in FIG. 15D, around a center of long sides of the fifth piezoelectric sheet 370, a seventh internal electrode 371a (B−) and an eighth internal electrode 372a (A−) forming a driving electrode layer for driving are arranged facing but isolated from each other.

The seventh internal electrode 371a (B−) that is arranged on a side of a long side 370U of the fifth piezoelectric sheet 370 and whose protrusion 371b is exposed to other long side 370L is guided so as not to come into contact with the eighth internal electrode 372a (A−).

The eighth internal electrode 372a (A−) arranged on the side of the long side 370L is extended such that its protrusion 372b is exposed to the long side 370L of the fifth piezoelectric sheet 370. Thus, the protrusions 371b and 372b are arranged on the same long side 370L.

The first internal electrode 341a (D+) and the third internal electrode 351a (D−), and the second internal electrode 342a (D+) and the fourth internal electrode 352a (C−) are formed on the positions facing each other when the second piezoelectric sheet 340 and the third piezoelectric sheet 350 are stacked. The first internal electrode 341a (D+) and the third internal electrode 351a (D−), and the second internal electrode 342a (C+) and the fourth internal electrode 352a (C−), respectively, form polarized regions for detecting the vibrations. These polarized regions are the vibration detecting electrode layers and, respectively, denoted as Phase D and Phase C.

The fifth internal electrode 361a (B+) and the seventh internal electrode 371a (B−), and the sixth internal electrode 362a (A+) and the eighth internal electrode 372a (A−) are formed on the positions facing each other when the fourth piezoelectric sheet 360 and the fifth piezoelectric sheet 370 are stacked. The fifth internal electrode 361a (B+) and the seventh internal electrode 371a (B−), and the sixth internal electrode 362a (A+) and the eighth internal electrode 372a (A−), respectively, form polarized regions for driving. These polarized regions are the driving electrode layers and, respectively, denoted as Phase B and Phase A.

A second external electrode 382 (D+) is formed on a front face 301F of the vibrator 301 so as to short circuit the protrusion 341b of each piezoelectric sheet 340 and a first external electrode 381 (C+) is formed on the front face 301F of the vibrator 301 so as to short circuit the protrusion 342b of each piezoelectric sheet 340 (FIG. 17A).

A third external electrode 383 (CD−) is formed on a rear face 301R of the vibrator 301 so as to short circuit the protrusion 351b of each piezoelectric sheet 350 (FIG. 17B). The first external electrode 381 (C+), the second external electrode 382 (D+), and the third external electrode 383 (CD−) are external electrodes connected to the vibration detecting electrode layer (Phase C or Phase D), These external electrodes are connected to the external detector (not shown) of the ultrasonic motor 100. As an example, the FPC is used for connection and one end of the FPC is connected to each electrode group. The third external electrode 383 (CD−) is used only during polarization and it is not connected when the ultrasonic motor 100 is being driven.

A fourth external electrode 391 (A+) is formed on the front face 301F of the vibrator 301 so as to short circuit the protrusion 361b of each piezoelectric sheet 360 and a fifth external electrode 392 (A−) is formed on the front face 301F of the vibrator 301 so as to short circuit the protrusion 362b of each piezoelectric sheet 360. Moreover, a sixth external electrode 393 (B+) is formed on the front face 301F of the vibrator 301 so as to short circuit the protrusion 372b of each piezoelectric sheet 370 and a seventh external electrode 394 (B−) is formed on the front face 301F of the vibrator 301 so as to short circuit the protrusion 371b of each piezoelectric sheet 370 (FIG. 17A).

The fourth external electrode 391 (A+) and the fifth external electrode 392 (A−), and the sixth external electrode 393 (B+) and the seventh external electrode 394 (B−) are external electrodes connected to the driving electrode layer (Phase A or Phase B). These external electrodes are connected to the external power source (not shown) of the ultrasonic motor 100. As an example, the FPC is used for connection and one end of the FPC is connected to each electrode group.

As shown in FIGS. 16 and 17A, the first external electrode 381 (C+), the second external electrode 382 (D+), the fourth external electrode 391 (A+), the fifth external electrode 392 (A−), the sixth external electrode 393 (B+), and the seventh external electrode 394 (B−), in other words, all the external electrodes that need to be connected to the power source or a detecting circuit when the ultrasonic motor 100 is being driven are formed on the front face 301F that is one of the side faces of the surface formed by stacking the first piezoelectric sheet 330, the second piezoelectric sheet 340, the third piezoelectric sheet 350, the fourth piezoelectric sheet 360, and the fifth piezoelectric sheet 370. On the other hand, as shown in FIG. 17B, the third external electrode 383 (CD−) that is not connected when the ultrasonic motor 100 is being driven is formed on the rear face 301R that is the other side face.

Similar to the vibrator 101 according to the first embodiment, the vibrator 301 is formed by cutting the multilayered piezoelectric element 320 in a direction in which a central axis 300c is inclined by a predetermined angle relative to the stacking direction S3 of the first piezoelectric sheet 330, the second piezoelectric sheet 340, the third piezoelectric sheet 350, the fourth piezoelectric sheet 360, and the fifth piezoelectric sheet 370. A long side on one side of the first piezoelectric sheet 330 and the long sides 340U, 350U, 360U, and 370U on one side of the second piezoelectric sheet 340, the third piezoelectric sheet 350, the fourth piezoelectric sheet 360, and the fifth piezoelectric sheet 370 are aligned and a side face to which each external electrode group is exposed forms the front face 301F. Moreover, a long side on the other side of the first piezoelectric sheet 330 and the long sides 340L, 350L, 360L, and 370L on the other side are aligned and a side face to which each external electrode group is exposed forms the rear face 301R. The friction contact members 103a and 103b are fixed using an adhesive to an upper surface of the cut vibrator 301.

Phase A and Phase B that are the driving electrode layers are arranged at positions that correspond to the common nodal positions of the longitudinal primary resonance vibration (FIG. 2C) and the torsional tertiary resonance vibration (FIG. 2E) of the vibrator 301, and include a central portion of the vibrator 301 in the long sides (in a direction of the central axis 300c) where the stress during vibration is maximum.

On the contrary, Phase C and Phase D that are the vibration detecting electrode layers are arranged at positions that are not on extended lines in the stacking direction S3 of Phase A and Phase B that are the driving electrode layers. Specifically, Phase C and Phase D are arranged at positions including the nodal positions (positions towards a central portion that is approximately ⅙th of a length of the long sides from an upper end face or a lower end face of the vibrator 301) of the torsional tertiary vibration different from the positions at which the driving electrode layers are arranged. Similarly as that of the first embodiment, Phase C and Phase D that are the vibration detecting electrode layers can be arranged on extended lines in the stacking direction indicated by the arrow S3 of Phase A and Phase B that are the driving electrode layers.

Effect

Because the electrodes that need to be wired when the ultrasonic motor is being operated (when the motor is being driven) are arranged on one surface of the multilayered piezoelectric element, these electrodes can be easily assembled.

Furthermore, other structures, operations, and effect are the same as those of the first embodiment.

Figure 18A:
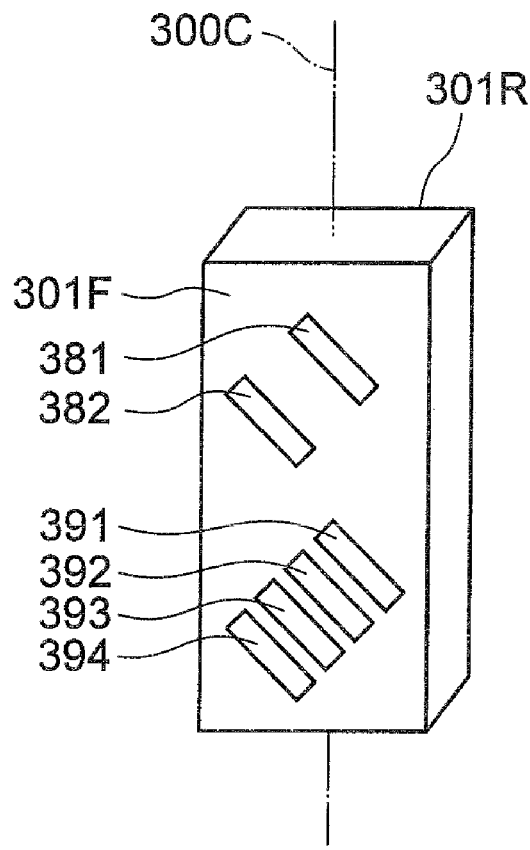
FIG. 18A is a perspective view, from an upper front side, of a structure of a vibrator according to a modification of the third embodiment
Figure 18B:
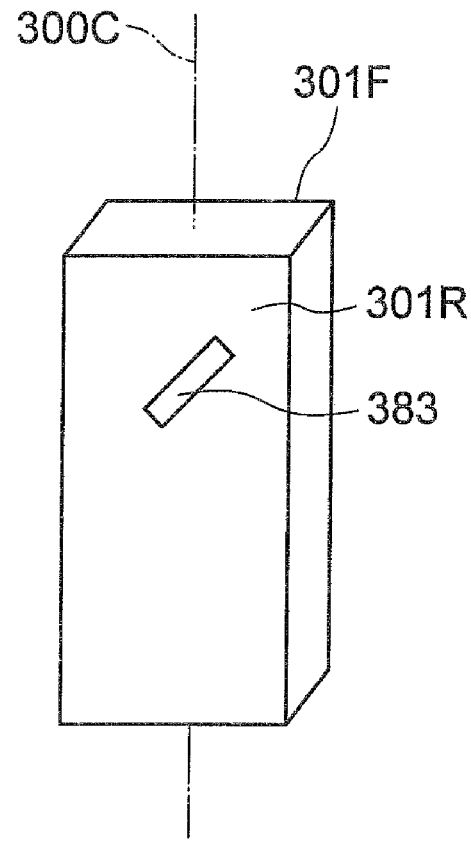
FIG. 18B is a perspective view, from an upper rear side, of a structure of the vibrator.

FIG. 18A is a perspective view, from an upper front side, of a structure of a vibrator according to a modification of the third embodiment and FIG. 18B is a perspective view, from an upper rear side, of the structure of the vibrator. The vibrator shown in FIGS. 18A and 18B is a longitudinal primary torsional secondary resonance vibrator formed such that a dimension ratio of long sides (a) and short sides (b) of a rectangle in a cross-section orthogonal to the central axis 300c of a multilayered piezoelectric element is approximately 0.6. In the vibrator, the driving electrode layer is provided on the position including the node portion of the torsional secondary resonance vibration, and the vibration detecting electrode layer is provided on a position, which includes the node portion of the torsional secondary resonance vibration and is different from the position where the driving electrode layer is provided. The same effect as that of the vibrator 301 shown in FIGS. 16 to 17B can be obtained with the vibrator according to the modification of the third embodiment.

As described above, the ultrasonic motor according to the present invention is smaller and has a simpler structure.

In the ultrasonic motor according to the present invention, because a vibrator can be formed with a single member, a structure of the vibrator can be simplified. Furthermore, because a conductive layer of internal electrodes for detecting vibrations is formed, a torsional resonance vibration component can be easily detected without providing a specific circuit and number of wirings that need to be connected to the vibrator when the motor is being driven can be reduced. Thus, it is beneficial for downsizing the ultrasonic motor. Furthermore, because a signal detecting the torsional resonance vibration component is a signal from the vibration detecting electrode layers that are connected in series, a signal voltage can be increased. Thus, it is beneficial when the motor is being driven at a low speed, that is, when the vibration speed is reduced.

What is claimed is:

1. An ultrasonic motor at least comprising:
a vibrator having a dimension ratio of a rectangle in a cross-section orthogonal to a central axis;
a rotor that is in contact with an elliptical vibration generating surface of the vibrator and that is rotated around the central axis, which is orthogonal to the elliptical vibration generating surface, wherein
an elliptical vibration is generated by combining a longitudinal primary resonance vibration resulting from an expansion and a contraction of the vibrator in a direction of the central axis and a torsional resonance vibration resulting from twisting of the vibrator around the central axis as a torsional axis, and
the dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibration resulting from twisting of the vibrator around the central axis as the torsional axis match, and
the ultrasonic motor includes a vibration detecting electrode layer, and
the torsional resonance vibration is a torsional secondary resonance vibration, and
the vibrator is formed by stacking a plurality of piezoelectric sheets,
the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and
polarity directions of the internal electrodes at the positions on either side of the center in the width direction of the piezoelectric sheet are the same.

2. An ultrasonic motor at least comprising:
a vibrator having a dimension ratio of a rectangle in a cross-section orthogonal to a central axis;
a rotor that is in contact with an elliptical vibration generating surface of the vibrator and that is rotated around the central axis, which is orthogonal to the elliptical vibration generating surface, wherein
an elliptical vibration is generated by combining a longitudinal primary resonance vibration resulting from an expansion and a contraction of the vibrator in a direction of the central axis and a torsional resonance vibration resulting from twisting of the vibrator around the central axis as a torsional axis, and
the dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibration resulting from twisting of the vibrator around the central axis as the torsional axis match, and
the ultrasonic motor includes a vibration detecting electrode layer, and the torsional resonance vibration is a torsional secondary resonance vibration, and
the vibrator is formed by stacking a plurality of piezoelectric sheets,
the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and
polarity directions at the positions on either side of the center in the width direction of the piezoelectric sheet are reversed.

3. An ultrasonic motor at least comprising:
a vibrator having a dimension ratio of a rectangle in a cross-section orthogonal to a central axis; and
a rotor that is in contact with an elliptical vibration generating surface of the vibrator and that is rotated around the central axis, which is orthogonal to the elliptical vibration generating surface, wherein
an elliptical vibration is generated by combining a longitudinal primary resonance vibration resulting from an expansion and a contraction of the vibrator in a direction of the central axis and a torsional resonance vibration resulting from twisting of the vibrator around the central axis as a torsional axis, and
the dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibration resulting from twisting of the vibrator around the central axis as the torsional axis match, and
the ultrasonic motor includes a vibration detecting electrode layer, and the torsional resonance vibration is a torsional tertiary resonance vibration, and
the vibrator is formed by stacking a plurality of piezoelectric sheets,
the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and
polarity directions at the positions on either side of the center in the width direction of the piezoelectric sheet are the same.

4. An ultrasonic motor at least comprising:
a vibrator having a dimension ratio of a rectangle in a cross-section orthogonal to a central axis; and
a rotor that is in contact with an elliptical vibration generating surface of the vibrator and that is rotated around the central axis, which is orthogonal to the elliptical vibration generating surface, wherein
an elliptical vibration is generated by combining a longitudinal primary resonance vibration resulting from an expansion and a contraction of the vibrator in a direction of the central axis and a torsional resonance vibration resulting from twisting of the vibrator around the central axis as a torsional axis, and
the dimension ratio of the rectangle of the vibrator is chosen such that a resonance frequency of the longitudinal primary resonance vibration resulting from the expansion and the contraction of the vibrator in the direction of the central axis and a resonance frequency of the torsional resonance vibration resulting from twisting of the vibrator around the central axis as the torsional axis match, and the ultrasonic motor includes a vibration detecting electrode layer, and the torsional resonance vibration is a torsional tertiary resonance vibration, and the vibrator is formed by stacking a plurality of piezoelectric sheets, the vibration detecting electrode layer includes a piezoelectric sheet having internal electrodes formed thereon at positions on either side of a center in a width direction thereof, and a piezoelectric sheet having internal electrodes formed thereon at positions on either side of a center in a width direction thereof that are short circuited, and polarity directions at the positions on either side of the center in the width direction of the piezoelectric sheet are reversed.

* * * * *